(12) United States Patent
Kawazu et al.

(10) Patent No.: US 12,293,963 B2
(45) Date of Patent: May 6, 2025

(54) WIRING SUBSTRATE AND ELECTRONIC DEVICE

(71) Applicant: KYOCERA Corporation, Kyoto (JP)

(72) Inventors: Yoshiki Kawazu, Kyoto (JP); Tomoya Kon, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 184 days.

(21) Appl. No.: 18/013,131

(22) PCT Filed: Jun. 28, 2021

(86) PCT No.: PCT/JP2021/024325
§ 371 (c)(1),
(2) Date: Dec. 27, 2022

(87) PCT Pub. No.: WO2022/004644
PCT Pub. Date: Jan. 6, 2022

(65) Prior Publication Data
US 2023/0307331 A1   Sep. 28, 2023

(30) Foreign Application Priority Data

Jun. 29, 2020 (JP) ................................. 2020-111235

(51) Int. Cl.
*H01L 23/498* (2006.01)
*H01L 31/02* (2006.01)
(Continued)

(52) U.S. Cl.
CPC .. *H01L 23/49811* (2013.01); *H01L 31/02005* (2013.01); *H01S 5/023* (2021.01); *H01L 31/0203* (2013.01)

(58) Field of Classification Search
CPC ............... H01L 23/49811; H01L 31/02; H01L 31/0203; H01S 5/023
(Continued)

(56) References Cited

U.S. PATENT DOCUMENTS

| 5,541,565 A | 7/1996 | Dowsing, III et al. |
| 5,736,784 A | 4/1998 | Dove |

(Continued)

FOREIGN PATENT DOCUMENTS

| JP | 2004063703 A | 2/2004 |
| JP | 4921498 B2 | 4/2012 |

(Continued)

*Primary Examiner* — Binh B Tran
(74) *Attorney, Agent, or Firm* — Volpe Koenig

(57) ABSTRACT

A wiring substrate includes a substrate having a first surface, a first lead terminal in contact with a ground conductor on the first surface, and a second lead terminal in contact with a signal conductor on the first surface and aligned with the first lead terminal. The first lead terminal includes a first end, a contacting part, a connecting part, a lead part and a second end. The contacting part includes the first end and is in contact with the ground conductor. The connecting part includes a first bend, a short-distance part and a second bend. The first bend is away from the first end across the contacting part. The second bend is closer to the second end than the first bend. The short-distance part has a shorter distance to the second lead terminal than the contacting part in plan view toward the first surface.

12 Claims, 13 Drawing Sheets

(51) Int. Cl.
    *H01S 5/023*     (2021.01)
    *H01L 31/0203*     (2014.01)

(58) Field of Classification Search
    USPC .......................................................... 361/748
    See application file for complete search history.

(56) References Cited

U.S. PATENT DOCUMENTS

2016/0261038 A1*   9/2016   Tanaka ..................... H03H 9/64
2021/0082796 A1*   3/2021   Shiomichi ............... H01L 23/64

FOREIGN PATENT DOCUMENTS

| | | | |
|---|---|---|---|
| JP | 2014216513 A | 11/2014 |
| JP | 2016-146439 A | 8/2016 |
| JP | 2019-114689 A | 7/2019 |
| WO | 2015088028 A1 | 6/2015 |

* cited by examiner

WIRING SUBSTRATE AND ELECTRONIC DEVICE

TECHNICAL FIELD

The present disclosure relates to a wiring substrate and an electronic device.

BACKGROUND ART

In Patent Literature 1, there is described a package for housing a high-frequency semiconductor device employing differential signaling as a transmission method. This package includes: a ceramic substrate; ground line conductors extending at right angles from the edge end of at least one side of the outer peripheral part of the lower surface of the ceramic substrate; and differential signal line conductors each composed of a pair of line conductors extending parallel to the ground line conductors and sandwiched between the ground line conductors on both sides.

CITATION LIST

Patent Literature

Patent Literature 1: JP 2016-146439 A

SUMMARY OF INVENTION

Problem to Solve

In a wiring substrate for mounting a high-frequency semiconductor device employing differential signaling as a transmission method, further improvement of high-frequency properties is desired.

The present disclosure relates to a wiring substrate and an electronic device having improved high-frequency properties.

Solution to Problem

A wiring substrate according to the present disclosure includes:
 a substrate having a first surface;
 a ground conductor on the first surface;
 a signal conductor on the first surface;
 a first lead terminal in contact with the ground conductor; and
 a second lead terminal in contact with the signal conductor and aligned with the first lead terminal,
 wherein the first lead terminal includes:
  a first end on the substrate in plan perspective view toward the first surface;
  a second end not on the substrate in the plan perspective view but at a position on an extension from the first end;
  a contacting part including the first end and in contact with the ground conductor;
  a connecting part including:
   a first bend away from the first end across the contacting part; and
   a second bend closer to the second end than the first bend; and
  a lead part connected to the second bend and extending to the second end, and
 wherein the connecting part includes a short-distance part having a shorter distance to the second lead terminal than the contacting part in plan view toward the first surface.

An electronic device according to the present disclosure includes:
 the above wiring substrate; and
 an electronic component connected to the wiring substrate.

Advantageous Effects

According to the present disclosure, a wiring substrate having improved high-frequency properties can be provided. Further, according to the present disclosure, an electronic device having excellent high-frequency properties can be provided.

DESCRIPTION OF EMBODIMENTS

Figure 1:
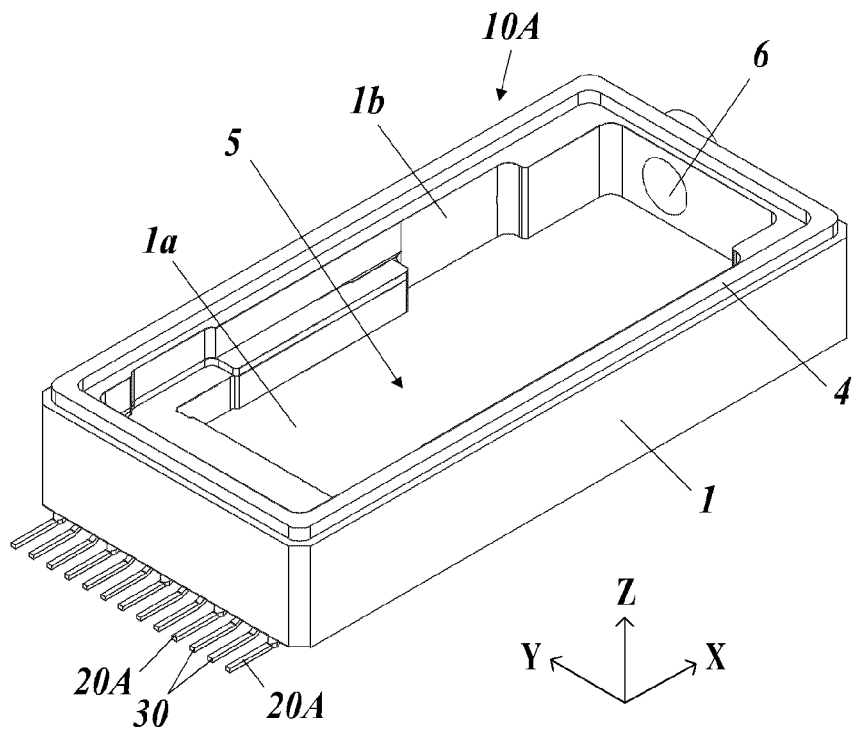
FIG. 1 is a perspective view showing a configuration of a wiring substrate of a first embodiment according to the present disclosure.

Hereinafter, embodiments of the present disclosure will be described with reference to the drawings. However, dimensions of components shown in the drawings do not faithfully represent the actual dimensions, dimensional ratios or the like of the components.

Wiring Substrate of First Embodiment

As shown in FIG. 1 to FIG. 5, a wiring substrate 10A of a first embodiment is a wiring substrate where an electronic component is to be mounted. The electronic component may be an electronic component that is driven at high frequency or an electronic component to and from which high-frequency signals are input and output. The wiring substrate 10A includes a substrate 1 having a first surface S1, ground conductors 2 located on the first surface S1, and signal conductors 3 located on the first surface S1.

Hereinafter, directions of components of the wiring substrate 10A will be described with an XYZ orthogonal coordinate system in which the thickness direction of the wiring substrate 10A is Z direction. The first surface S1 of the substrate 1 of the wiring substrate 10A is parallel to XY plane. Hereinafter, surfaces of each layer of the wiring substrate 10A facing +Z direction and −Z direction may be referred to as "upper surface" and "lower surface", respectively.

The substrate 1 has a rectangular plate-like bottom 1a, and the lower surface of the bottom 1a constitutes the first surface S1. The substrate 1 also has a frame 1b located on the upper surface of the bottom 1a along the outer periphery of the bottom 1a. The upper surface of the bottom 1a and the inner surface of the frame 1b form a cavity. The upper surface of the bottom 1a is a mounting surface having a mounting part 5 where an electronic component is to be mounted. The substrate 1 further has a through hole 6 in a part of the frame 1b. The wiring substrate 10A has a seal ring 4 on the upper surface of the frame 1b of the substrate 1.

The substrate 1 is composed of a plurality of insulating substrates stacked on top of one another in the thickness direction, for example. As the insulating substrates, for example, a ceramic material, such as an aluminum oxide sintered body, a mullite sintered body, a silicon carbide sintered body, an aluminum nitride sintered body or a silicon nitride sintered body, or a glass ceramic material can be used. The seal ring 4 is used as a seal material for airtight sealing with a lid after an electronic component is mounted on the mounting part 5. The seal ring 4 is configured, for example, such that a frame-shaped conductor made of conducive paste containing a high-melting-point metal, such as tungsten or molybdenum, is brazed and joined (bonded) to a frame-shaped metal plate made of an Fe—Ni-based alloy or an Fe—Ni—Co-based alloy with a brazing material or the like.

Figure 2:
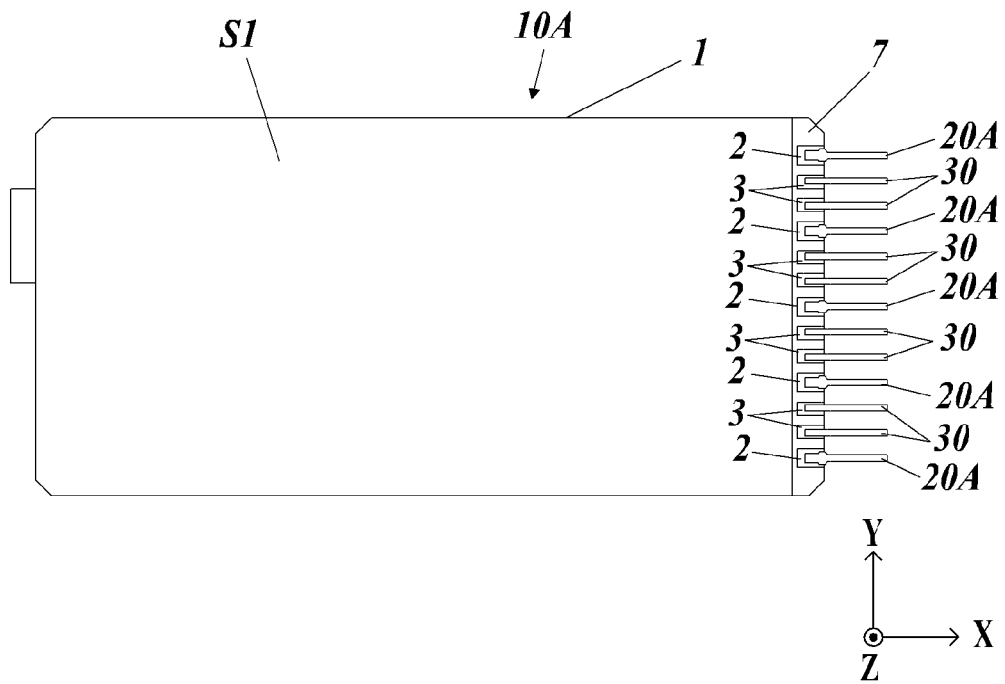
FIG. 2 is a plan view of the wiring substrate shown in FIG. 1 when viewed toward a first surface of a substrate.
Figure 3:
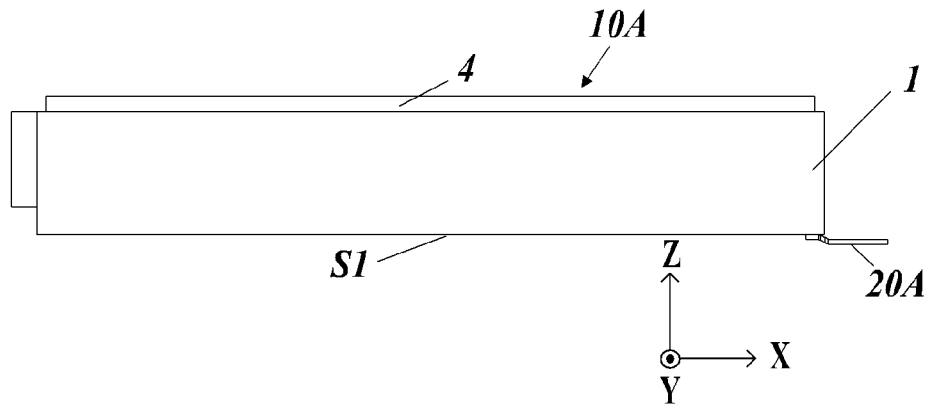
FIG. 3 is a side view of the wiring substrate shown in FIG. 1.

In the wiring substrate 10A, the first surface S1 of the substrate 1 is, for example, rectangular, and has two long sides parallel to X direction and two short sides parallel to Y direction. As shown in FIG. 2, in the case of the rectangular first surface S1, the ground conductors 2 and the signal conductors 3 are arranged along one short side of the first surface S1 such that one ground conductor 2 alternates with two signal conductors 3, and at each end, a ground conductor 2 is present. A ground conductor 2 and a signal conductor 3 adjacent to one another and signal conductors 3 adjacent to one another are arranged so as to be insulated from one another.

The ground conductors 2 and the signal conductors 3 on the first surface S1 is, for example, rectangular and may have a predetermined width and a predetermined length inward from the edge of the short side of the first surface S1. The ground conductors 2 may be U-shaped so as to surround the signal conductors 3. The "U-shaped" is, in other words, a shape formed by ends of two ground conductors 2 connected by a metallic object. Areas of the ground conductors 2 and the signal conductors 3 on the first surface S1 and spaces between the adjacent ground conductor 2 and signal conductor 3 and between the adjacent signal conductors 3 thereon are appropriately determined on the basis of design of an electronic device to which the wiring substrate 10A is applied. The ground conductors 2 and the signal conductors 3 contain a metal material, such as gold, silver, copper, nickel, tungsten, molybdenum or manganese. The ground conductors 2 and the signal conductors 3 may be formed on the first surface S1 by co-firing with the substrate 1 in the form of a metallized layer(s), a plating layer(s) or the like or by metal plating. The ground conductors 2 and the signal conductors 3 may have a substantially uniform thickness throughout, which may be about 5 to 30 μm.

The ground conductors 2 and the signal conductors 3 may be surrounded by a coating member 7. By the ground conductors 2 and the signal conductors 3 being surrounded by the coating member 7, when the ground conductors 2 and the signal conductors 3 are respectively connected to first lead terminals and second lead terminals with a joining (bonding) material, the joining material is stemmed at boundaries between (i) the ground conductors 2 and the signal conductors 3 and (ii) the coating member 7. This can reduce spread of the joining material on the first surface S1, and this reduction of spread of the joining material reduces change in inductance due to spread of the joining material, so that the wiring substrate 10A is impedance-matched. The reduction of spread of the joining material also results in forming a moderate fillet of the joining material, so that joining strength (bonding) of the ground conductors 2 and the first lead terminals and joining (bonding) strength of the signal conductors 3 and the second lead terminals increase.

The shape of the coating member 7 is not limited to the above. For example, only either the ground conductors 2 or the signal conductors 3 may be surrounded by the coating member 7. Alternatively, the coating member 7 may be arranged so as to surround each ground conductor 2 and also surround two adjacent signal conductors 3 collectively. In any case, reduction of spread of the joining material results in forming a moderate fillet of the joining material, so that joining strength of the ground conductors 2 and the first lead terminals and joining strength of the signal conductors 3 and the second lead terminals increase. The shape of the coating member so as to surround two adjacent signal conductors 3 collectively can also achieve miniaturization of the wiring substrate 10A in addition to increase in the joining strength.

As the coating member 7, for example, a ceramic material, such as an aluminum oxide sintered body, a chromium sintered body, a mullite sintered body, a silicon carbide sintered body, an aluminum nitride sintered body or a silicon nitride sintered body, or a glass ceramic material can be used.

The wiring substrate 10A has first lead terminals 20A that are in contact with the respective ground conductors 2 and second lead terminals 30 that are aligned with the first lead terminals 20A and in contact with the respective signal conductors 3. The first lead terminals 20A and the second lead terminals 30 extend at right angles to, of the first surface S1, the short side(s) that is parallel to the Y direction, namely extend parallel to the X direction. The first lead terminals 20A and the second lead terminals 30 are, for example, connected to outside, so that an electronic component mounted on the mounting part 5 of the substrate 1 outputs and receives electric signals to and from the outside.

The bottom 1a of the substrate 1 is, for example, mainly composed of an insulating substrate(s), and has a wiring conductor(s), a through conductor(s) and/or the like therein so that an electronic component or its peripheral components on the mounting part 5 of the upper surface are electrically connected to the ground conductors 2 and the signal conductors 3 on the lower surface. This allows an electronic component mounted on the mounting part 5 to output and receive electric signals to and from the outside via the first lead terminals 20A and the second lead terminals 30 that are respectively in contact with the ground conductors 2 and the signal conductors 3.

The first lead terminals 20A and the second lead terminals 30 are made of a metal material, and for example, after molded into the shapes described below, respectively joined to the ground conductors 2 and the signal conductors 3 with a joining material, such as a brazing material. The material of the first lead terminals 20A and the second lead terminals 30 may be a metal, such as copper, iron, nickel, cobalt or chromium, or a metallic alloy containing such a metal, for example.

Each first lead terminal 20A has a first end 21 at a position on the substrate 1 in plan perspective view toward the first surface S1 and a second end 22 not on the substrate 1 but at a position on an extension from the first end 21 in parallel to the X direction. The first lead terminal 20A has a contacting part 23, a connecting part 26 and a lead part 27 in this order from the first end 21 to the second end 22. The first lead terminal 20A has a second surface S2 facing the first surface S1 and a third surface S3 opposite the second surface S2. The first lead terminal 20A may be a long, narrow plate having predetermined width, length and thickness, for example. In this embodiment, the first lead terminal 20A has a substantially uniform thickness along the length direction. The width direction, length direction and thickness direction of the first lead terminal 20A are a direction parallel to the Y direction, a direction parallel to the X direction and a direction parallel to the Z direction, respectively.

The contacting part 23 is a part that includes the first end 21 and at which the second surface S2 contacts the ground conductor 2. The connecting part 26 is a part that includes a first bend 24 at a positon away from the first end 21 across the contacting part 23 and a second bend 25 at a position closer to the second end 22 than the first bend 24. The first bend 24 is where the second surface S2 separates from the ground conductor 2. More specifically, the contacting part 23 is a part from the first end 21 to the first bend 24, and the connecting part 26 is a part from the first bend 24 to the second bend 25. The lead part 27 is a part connected to the second bend 25 and extending to the second end 22.

The first bend 24 is where the first lead terminal 20A is bent in the −Z direction, namely downward, so as to separate from the ground conductor 2. The second bend 25 is where the first lead terminal 20A is bent in the +Z direction, namely upward, with respect to the bending direction at the first bend 24. In the case of the first lead terminal 20A, the entire first lead terminal 20A is bent at the first bend 24 and the second bend 25, but like a first lead terminal(s) 20F described below, only the second surface S2 may be bent at the first bend 24 and the second bend 25. That is, in a wiring substrate of an embodiment, at least the second surface of each first lead terminal has a first bend and a second bend.

The first lead terminal 20A having the first bend 24, the second bend 25 or both can absorb, with the first bend 24 or the second bend 25, pressure applied to the first lead terminal 20A when an external board is connected to the wiring substrate 10A. This can reduce occurrence of damage to the first lead terminal 20A.

Figure 5:
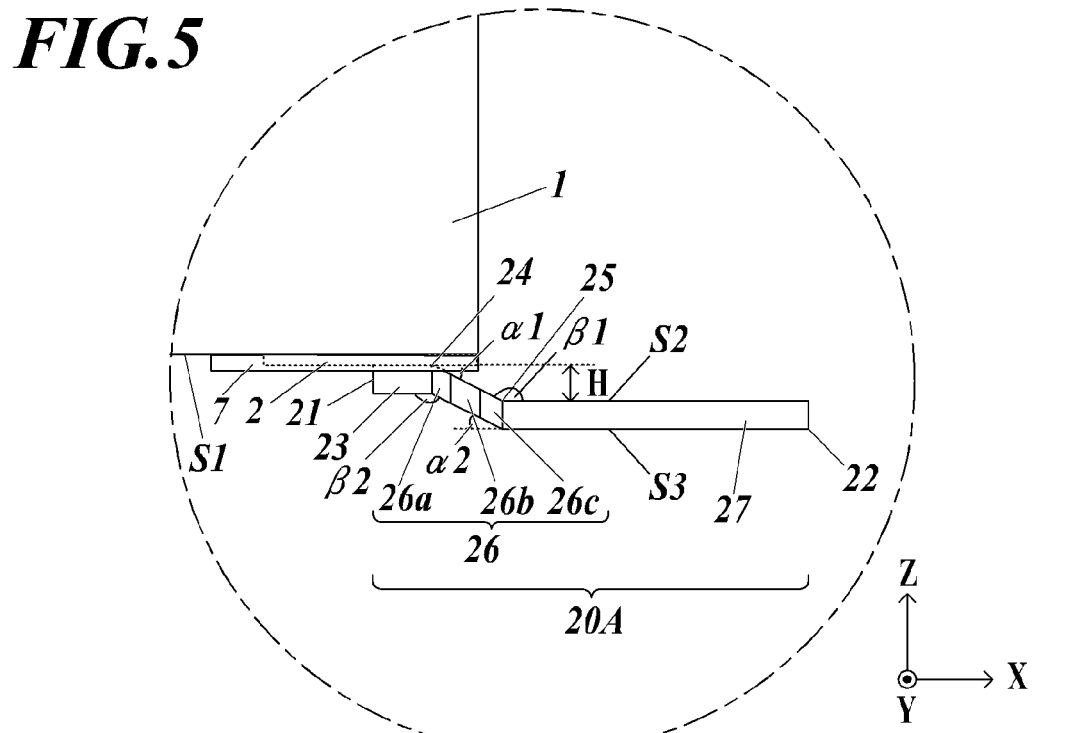
FIG. 5 is an enlarged view of a first lead terminal and its surroundings shown in FIG. 3.

The second surface S2 of the first lead terminal 20A is, for example, a surface parallel to the first surface S1 at the contacting part 23, a surface having a predetermined angle to the first surface S1 at the connecting part 26, and a surface parallel to the first surface S1 at the lead part 27. In FIG. 5, an angle formed by the second surface S2 at the connecting part 26 and a plane obtained by extending the second surface S2 at the contacting part 23 is represented by "α1". The angle α1 may range from 20 to 60 degrees, for example. Further, in FIG. 5, an angle formed by the second surface S2 at the connecting part 26 and the second surface S2 at the lead part 27 is represented by "$1". In the case where the second surface S2 of the first lead terminal 20A is a surface parallel to the first surface S1 at the lead part 27, the angle β1 is expressed by "180-α1".

As shown in FIG. 5, the entire first lead terminal 20A is bent at the first bend 24 and the second bend 25. The third surface S3 may have the same shape as the second surface S2, for example. For example, in the case where an angle formed by the third surface S3 at the contacting part 23 and the third surface S3 at the connecting part 26 is represented by "β2", and an angle formed by the third surface S3 at the connecting part 26 and a plane obtained by extending the third surface S3 at the lead part 27 is represented by "α2", "Angle β2≈Angle β1" and "Angle α2=Angle α1" may hold. The lead part 27 is, for example, a part that is connected to an external board, such as a flexible board, such that the third surface S3 at the lead part 27 contacts the upper surface of the external board.

In the first lead terminal 20A, the connecting part 26 is a part that is not in contact with either the ground conductor 2 or an external board and is located in a region in mid-air. Distance H between the plane obtained by extending the second surface S2 of the first lead terminal 20A at the contacting part 23 and the second surface S2 thereof at the lead part 27 may be about 0.1 to 0.5 mm.

Figure 4A:
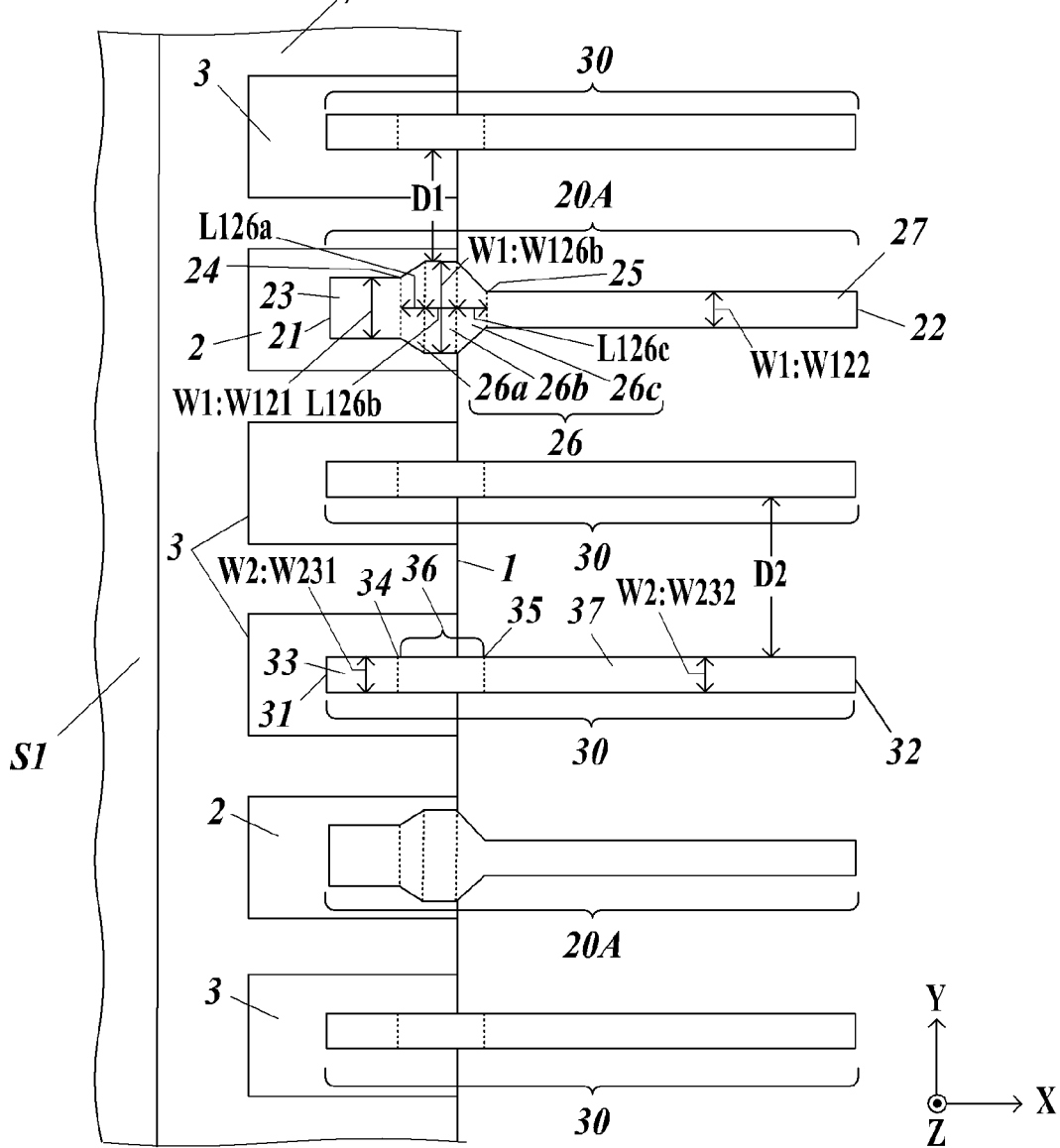
FIG. 4A is an enlarged view of first lead terminals, second lead terminals and their surroundings shown in FIG. 2.

When the first lead terminal 20A is viewed in the XY plane, which is parallel to the first surface S1, the connecting part 26 has a part having a shorter distance D1 to the second lead terminal(s) 30 than the contacting part 23 (FIG. 4A). More specifically, the connecting part 26 is composed of a first tapered part 26a, a second tapered part 26c and an interconnecting part 26b. The first tapered part 26a is a part where a width W1 increases toward the second end 22. The second tapered part 26b is a part that is located closer to the second end 22 than the first tapered part 26a and where the width W1 decreases toward (to) the lead part 27. The interconnecting part 26c is a part that is located between the first tapered part 26a and the second tapered part 26c. The first tapered part 26a is a region from the first bend 24 to its boundary with the interconnecting part 26b, and the second tapered part 26c is a region from its boundary with the interconnecting part 26b to the second bend 25.

In the wiring substrate 10A, except for the first lead terminals 20A located at both ends of the first surface S1 of the substrate 1 in the Y direction, each first lead terminal 20A is interposed between two second lead terminals 30. The first lead terminal 20A has the width W1 that gradually increases at the first tapered part 26a such that the sides extending in the length direction (X direction) are spread in the width direction (Y direction) until they reach the interconnecting part 26b. The first lead terminal 20A has the width W1 that is kept unchanged at the interconnecting part 26b from the first end 21 toward the second end 22. That is, the width W1 at the interconnecting part 26b is uniform. This makes it possible to stably adjust impedance. The first lead terminal 20A has the width W1 that gradually decreases at the second tapered part 26c such that the sides extending in the length direction (X direction) get closer in the width direction (Y direction). The sides of the first lead terminal 20A extending in the length direction are substantially symmetrical about a center line that connects the center of the first end 21 and the center of the second end 22. In the above, the width W1 at the first tapered part 26a may gradually increase from the first end 21 toward the second end 22 at a predetermined rate, and/or the width W1 at the second tapered part 26c may gradually decrease from the first end 21 toward the second end 22 at a predetermined rate. This can gradually change impedance at the signal conductor 3 and the second lead terminal 30 that are adjacent to the first lead terminal 20A and hence makes impedance adjustment easy.

As described below, the dimension in the length direction of the second lead terminals 30 may be the same as that of the first lead terminals 20A. That is, the second lead terminals 30 and the first lead terminals 20A may have the same length. The second lead terminals 30 are parallel to the first lead terminals 20A. Each second lead terminal 30 has a predetermined narrow width W2 that is set, for example, in conformity with desired high-frequency properties and strength. In order to transmit high-frequency signals, the second lead terminal 30 is formed such that the width W2 does not greatly change. A first lead terminal 20A and two second lead terminals 30 between which the first lead terminal 20A is interposed having their respective configurations described above allow the first lead terminal 20A to have, at the interconnecting part 26b of the connecting part 26, the shortest distance D1 to each of the second lead terminals 30 located on both sides. In this embodiment, the distance D1 between a first lead terminal 20A and a second lead terminal 30 located on one side of the first lead terminal 20A is the same as the distance D1 between the first lead terminal 20A and a second lead terminal 30 located on the other side thereof.

At the part at which the distance D1 between the first lead terminal 20A and each of the second lead terminals 30 becomes the shortest, the distance D1 may be about 0.2 to 1.0 mm, for example. The first lead terminal 20A having, in the connecting part 26 located in mid-air, a part having a short distance D1 to each of the second lead terminals 30 makes impedance matching easy. Hence, the wiring substrate 10A is excellent in high-frequency properties. Further, the first lead terminal 20A having a wide width W1 at the connecting part 26 can have a large volume. This reduces occurrence of crosstalk. Hence, the wiring substrate 10A is excellent in high-frequency properties.

The first lead terminal 20A including the connecting part 26 having the first tapered part 26a, the interconnecting part 26b and the second tapered part 26c has the following advantages. The first lead terminal 20A having the first tapered part 26a and the second tapered part 26c is easy to process. That is, the first lead terminal 20A has higher workability than that having a corner(s) of an exterior angle of less than 90 degrees at a point(s) at/from which the width W1 changes. Further, the first lead terminal 20A having the first tapered part 26a and the second tapered part 26c has less stress concentration at a point(s) at/from which the width W1 changes than that having a corner(s) of an exterior angle of, for example, 90 degrees at a point(s) at/from which the width W1 changes. This can reduce, in the first lead terminal 20A, appearance of cracks or the like due to pressure or the like from the outside.

The width W1 of the first lead terminal 20A at the lead part 27 is determined by design of an external board, for example. If the set width W1 at the lead part 27 is narrow, it is, for the reasons described above, advantageous to the first lead terminal 20A to have the second tapered part 26c. In the first lead terminal 20A, the interconnecting part 26b is the part where the width W1 becomes the largest. In order to increase the volume of the first lead terminal 20A and increase the area of the part where the distance D1 between the first lead terminal 20A and the second lead terminal 30 becomes the shortest, it is advantageous to the interconnecting part 26b to have a longer length. However, if the length of the interconnecting part 26b is increased, the sides along the length direction are bent at approximately 90 degrees at points of the first tapered part 26a, the points where the width W1 starts and finishes increasing, and at points of the second tapered part 26c, the points where the width W1 starts and finishes decreasing. As a result, stress concentrates on the first tapered part 26a and the second tapered part 26c. This could be disadvantageous in terms of strength.

Hence, the ratio of the lengths of the first tapered part 26a, the interconnecting part 26b and the second tapered part 26c of the first lead terminal 20A can be appropriately selected with a balance between workability and volume increase taken into account. In the first lead terminal 20A, the first tapered part 26a and the interconnecting part 26b lie on the substrate 1 in plan perspective view toward the first surface S1. The first tapered part 26a that is located inside of the outer periphery of the substrate 1 and bent can increase, in mid-air, the area of the part having a short distance D1 between the first lead terminal 20A and the second lead terminal 30. In mid-air, what surrounds the first lead terminal 20A is air having a lower dielectric constant than the substrate 1. Hence, the distance D1 between the first lead terminal 20A and the second lead terminal 30 being short makes impedance adjustment of the first lead terminal 20A and the second lead terminal 30 easy.

Each second lead terminal 30 has a first end 31 and a second end 32. The first end 31 is at a position on the substrate 1 in plan perspective view toward the first surface S1. The second end 32 is not on the substrate 1 but at a position on an extension from the first end 31 in parallel to the X direction. The second lead terminal 30 has a contacting part 33, a connecting part 36 and a lead part 37 in this order from the first end 31 to the second end 32. The second lead terminal 30 has a fourth surface facing the first surface S1 and a fifth surface opposite the fourth surface. The second lead terminal 30 may be a long, narrow plate having predetermined width, length and thickness, for example. In this embodiment, the second lead terminal 30 has a substantially uniform thickness along the length direction, like the first lead terminal 20A.

The width direction, length direction and thickness direction of the second lead terminal 30 may coincide with the width direction, length direction and thickness direction of the first lead terminal 20A, respectively. More specifically, the width direction, length direction and thickness direction of the second lead terminal 30 are a direction parallel to the Y direction, a direction parallel to the X direction and a direction parallel to the Z direction, respectively.

As shown in FIG. 4A, the width of the second lead terminal 30 on the second end 32 side may be the same as the width of the first lead terminal 20A on the second end 22 side. Since the first lead terminal 20A has the above-described configuration, the width W1 (W122) of the first lead terminal 20A on the second end 22 side is smaller than the width W1 (W121) of the first lead terminal 20A on the first end 21 side. Meanwhile, the width W2 (W232) of the second lead terminal 30 on the second end 32 side is the same as the width W2 (W231) of the second lead terminal 30 on the first end 31 side. Hence, in this embodiment, "Width W121>Width W122=Width W231=Width W232" holds.

In the case where the width at the interconnecting part 26b is represented by W126b, "Width 126b>Width W121>Width W122" may hold. That is, "Difference between Width W126b and Width W121>Difference between Width W126b and Width W122" may hold. In this case, stable impedance adjustment and package miniaturization can be achieved appropriately.

Further, as shown in FIG. 4A, the length (dimension in the length direction) L1 of the first lead terminal 20A may have the following relationship at the connecting part 26. In the case where the length at the first tapered part 26a is represented by L126a, and the length at the second tapered part 26c is represented by L126c, "L126a<L126c" may hold. In this case, stable impedance adjustment and package miniaturization can be achieved appropriately. Further, in the case where the length at the interconnecting part 26b is represented by L126b, "L126a<L126c<L126b" may hold.

The contacting part 33 of the second lead terminal 30 is a part that includes the first end 31 and at which the fourth surface contacts the signal conductor 3. The connecting part 36 of the second lead terminal 30 is a part that includes a first bend 34 at a position away from the first end 31 across the contacting part 33 and a second bend 35 at a position closer to the second end 32 than the first bend 34. The first bend 34 is where the fourth surface separates from the signal conductor 3. More specifically, the contacting part 33 of the second lead terminal 30 is a part from the first end 31 to the first bend 34, and the connecting part 36 of the second lead terminal 30 is a part from the first bend 34 to the second bend 35. The lead part 37 of the second lead terminal 30 is a part connected to the second bend 35 and extending to the second end 32.

The second lead terminal 30 may have the same lateral shape as the first lead terminal 20A, for example. In the second lead terminal 30, the first bend 34 is where the second lead terminal 30 is bent in the −Z direction, namely downward, so as to separate from the signal conductor 3, and the second bend 35 is where the second lead terminal 30 is bent in the +Z direction, namely upward, with respect to the bending direction at the first bend 34. The second lead terminal 30 having the first bend 34, the second bend 35 or both can reduce, with the first bend 34 or the second bend 35, pressure applied to the second lead terminal 30 when an external board is connected to the wiring substrate 10A. This can reduce occurrence of damage to the second lead terminal 30.

The fourth surface of the second lead terminal 30 is, for example, a surface parallel to the first surface S1 at the contacting part 33, a surface having a predetermined angle to the first surface S1 at the connecting part 36, and a surface parallel to the first surface S1 at the lead part 37. An angle formed by the fourth surface at the connecting part 36 and a plane obtained by extending the fourth surface at the contacting part 33 may be in the same range as the angle α1. Further, an angle formed by the fourth surface at the connecting part 36 and the fourth surface at the lead part 37 may be in the same range as the angle β1.

The entire second lead terminal 30 is bent at the first bend 34 and the second bend 35. The fifth surface may have the same shape as the fourth surface. The lead part 37 of the second lead terminal 30 is, for example, a part that is connected to an external board, such as a flexible board, such that the fifth surface at the lead part 37 contacts the upper surface of the external board. The fifth surface of the second lead terminal 30 at the lead part 37 is usually on the same plane as the third surface S3 of the first lead terminal 20A at the lead part 27. In the second lead terminal 30, the connecting part 36 is a part that is not in contact with either the signal conductor 3 or an external board and is located in a region in mid-air.

When the second lead terminal 30 is viewed in the XY plane, which is parallel to the first surface S1, the width W2 of the second lead terminal 30 may be uniform at the contacting part 33, the connecting part 36 and the lead part 37 (FIG. 4A). Hence, distance D2 between two second lead terminals 30 adjacent to one another is kept uniform from the first end(s) 31 to the second end(s) 32 of the second lead terminal(s) 30. In contrast, the distance D1 between a second lead terminal 30 and a first lead terminal 20A adjacent to one another becomes the shortest at the interconnecting part 26b of the connecting part 26 of the first lead terminal 20A.

Modification of Wiring Substrate of First Embodiment

Figure 4B:
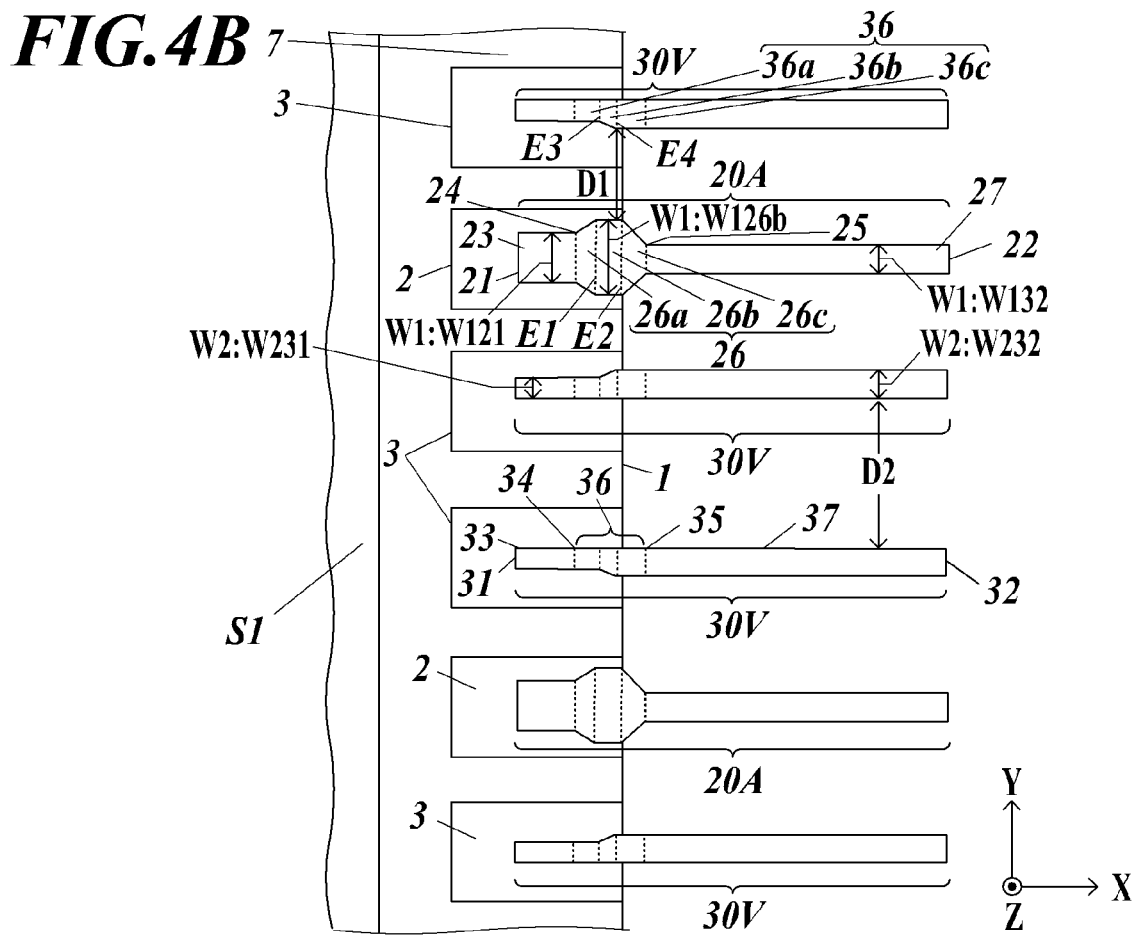
FIG. 4B shows first lead terminals, second lead terminals and their surroundings in a modification of the wiring substrate of the first embodiment according to the present disclosure.

FIG. 4B is an enlarged view of first lead terminals, second lead terminals and their surroundings in a wiring substrate 10A' as a modification of the wiring substrate 10A of the first embodiment. The wiring substrate 10A' is configured in the same manner as the wiring substrate 10A of the first embodiment except that the second lead terminals 30 in the wiring substrate 10A of the first embodiment are replaced by second lead terminals 30V. Hereinafter, regarding the wiring substrate 10A', the second lead terminals 30V, which are different from the second lead terminals 30, are mainly described.

In the wiring substrate 10A', the second lead terminals 30V and the first lead terminals 20A are arranged so as to be adjacent to one another in plan view as in the wiring substrate 10A. More specifically, a configuration in which one first lead terminal 20A is interposed between second lead terminals 30V as a pair is repeated in the Y direction, so that the second lead terminals 30V and the first lead terminals 20A are adjacent to and aligned with one another in plan view. This arrangement constitutes GSSG (Ground/Signal/Signal/Ground) differential signal wirings. As in the embodiment, G (Ground) in GSSG may be shared by differential signal wirings adjacent to one another.

Each second lead terminal 30V has the first end 31 and the second end 32, like each second lead terminal 30. The second lead terminal 30V has the contacting part 33, the connecting part 36 and the lead part 37 in this order from the first end 31 to the second end 32. The second lead terminal 30V has the fourth surface facing the first surface S1 and the fifth surface opposite the fourth surface.

The second lead terminal 30V has a third tapered part 36b at which, in plan view, the side of the second lead terminal 30V facing the first lead terminal 20A adjacent to the second lead terminal 30V has a shorter distance to the first lead terminal 20A as the side further separates from the signal conductor 3. The side facing the first lead terminal 20A adjacent to the second lead terminal 30V is, of the two sides of the second lead terminal 30V extending in the length direction, the side close to the adjacent first lead terminal 20A. The second lead terminal 30V provided with this third tapered part 36 can secure the width of the second lead terminal 30V on the second end 32 side so as to conform to standards and gradually change impedance of the second lead terminal 30V, and also can make the width of the second lead terminal 30V on the first end 31 side small and make the width of the signal conductor 3 small accordingly. As a result, both easy impedance adjustment and wiring substrate miniaturization can be achieved.

The third tapered part 36b can be provided, for example, in the connecting part 36 of the second lead terminal 30V. In this case, the contacting part 33, the connecting part 36 and the lead part 37 of the second lead terminal 30V are the same as those of the second lead terminal 30 except that the connecting part 36 has the third tapered part 36b at which the width W2 gradually increases. The connecting part 36 has, for example, a first interconnecting part 36a, the third tapered part 36b and a second interconnecting part 36c in this order from the first end 31 side toward the second end 32. At the first interconnecting part 36a, the width W2 of the second lead terminal 30V is uniform. At the third tapered part 36b, the width W2 of the second lead terminal 30V increases from the first end 31 side toward the second end 32. At the second interconnecting part 36c, the increased width W2 is kept as it is.

In the wiring substrate 10A', the width W1 of the first lead terminal 20A at the interconnecting part 26b, namely the width W1 at the part having a short distance (short-distance part) to the second lead terminal 30V, is uniform, and, in plan view, the third tapered part 36b of the second lead terminal 30V is adjacent to the interconnecting part 26b of the first lead terminal 20A. In the second lead terminal 30V shown in FIG. 4B, the third tapered part 36b is, over its entire length in the length direction, adjacent to the interconnecting part 26b of the first lead terminal 20A. However, arrangement of the third tapered part 36b is not limited thereto. The third tapered part 36b is at least partly adjacent to the interconnecting part 26b of the first lead terminal 20A. The second lead terminal 30V having this third tapered part 36b makes it easy to stably adjust impedance.

Regarding the second lead terminal 30V shown in FIG. 4B, the position of the third tapered part 36b is described in detail. In plan view, in a direction from the first end 21 to the second end 22 of the first lead terminal 20A, namely the X direction, an end of the interconnecting part 26b (short-distance part to the second lead terminal 30V) of the first lead terminal 20A close to the ground conductor 2 is represented by E1, and an end of the interconnecting part 26b (short-distance part to the second lead terminal 30V) of the first lead terminal 20A far from the ground conductor 2 is represented by E2. Further, in plan view, in the X direction, an end of the third tapered part 36b close to the signal conductor 3 is represented by E3, and an end of the third tapered part 36b far from the signal conductor 3 is represented by E4. In this case, the end E3 of the third tapered part 36b is, in plan view, closer to the second end 22 than the end E1 of the interconnecting part 26b of the first lead terminal 20A. Further, the end E4 of the third tapered part 36b is, in plan view, closer to the first end 21 than the end E2 of the interconnecting part 26b of the first lead terminal 20A. This arrangement of the third tapered part 36b of the second lead terminal 30V can achieve both easy impedance adjustment and wiring substrate miniaturization.

In this embodiment too, as shown in FIG. 4B, the width of the second lead terminal 30V on the second end 32 side may be the same as the width of the first lead terminal 20A on the second end 22 side. As in the case shown in FIG. 4A, the width W1 (W122) of the first lead terminal 20A on the second end 22 side is smaller than the width W1 (W121) of the first lead terminal 20A on the first end 21 side. Meanwhile, unlike the case shown in FIG. 4A, the width W2 (W232) of the second lead terminal 30V on the second end 32 side is larger than the width W2 (W231) of the second lead terminal 30V on the first end 31 side. Hence, in this embodiment, "Width W121>Width W122=Width W232>Width W231" holds.

Wiring Substrates of Second to Sixth Embodiments

Wiring substrates of second to sixth embodiments are configured in the same manner as the wiring substrate 10A of the first embodiment except that the first lead terminals 20A in the wiring substrate 10A of the first embodiment are replaced by first lead terminals 20B to 20F. In the following descriptions of the wiring substrates of the second to sixth embodiments, the same components as those of the wiring substrate 10A of the first embodiment are denoted by the same reference signs as those used in the wiring substrate 10A to avoid duplicate descriptions, and different points from the wiring substrate 10A are mainly described.

Hereinafter, the wiring substrate of the second embodiment with the first lead terminals 20A replaced by the first lead terminals 20B is referred to as a wiring substrate 10B, the wiring substrate of the third embodiment with the first lead terminals 20A replaced by the first lead terminals 20C is referred to as a wiring substrate 10C, the wiring substrate of the fourth embodiment with the first lead terminals 20A replaced by the first lead terminals 20D is referred to as a wiring substrate 10D, the wiring substrate of the fifth embodiment with the first lead terminals 20A replaced by the first lead terminals 20E is referred to as a wiring substrate 10E, and the wiring substrate of the sixth embodiment with the first lead terminals 20A replaced by the first lead terminals 20F is referred to as a wiring substrate 10F.

Figure 6A:
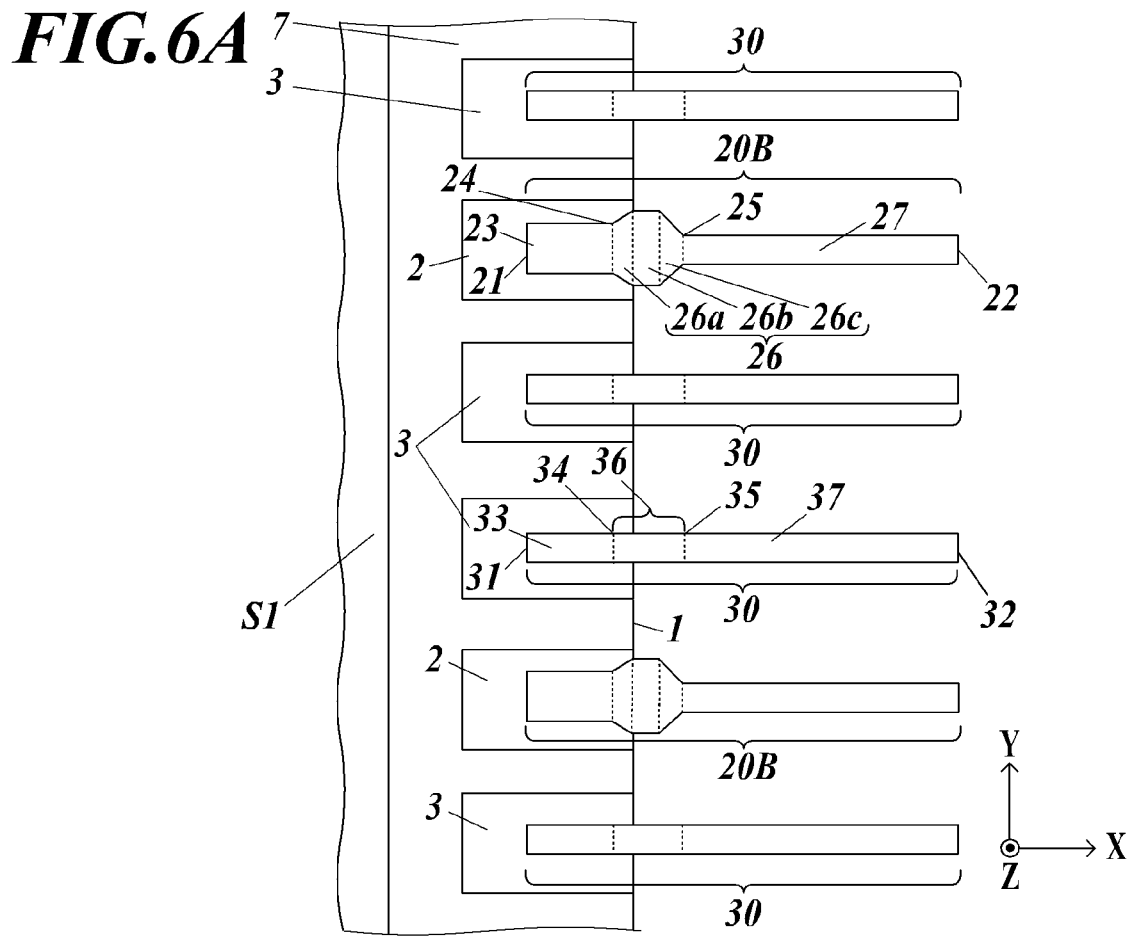
FIG. 6A is a plan view showing first lead terminals, second lead terminals and their surroundings when a wiring substrate of a second embodiment according to the present disclosure is viewed toward a first surface of a substrate.
Figure 6B:
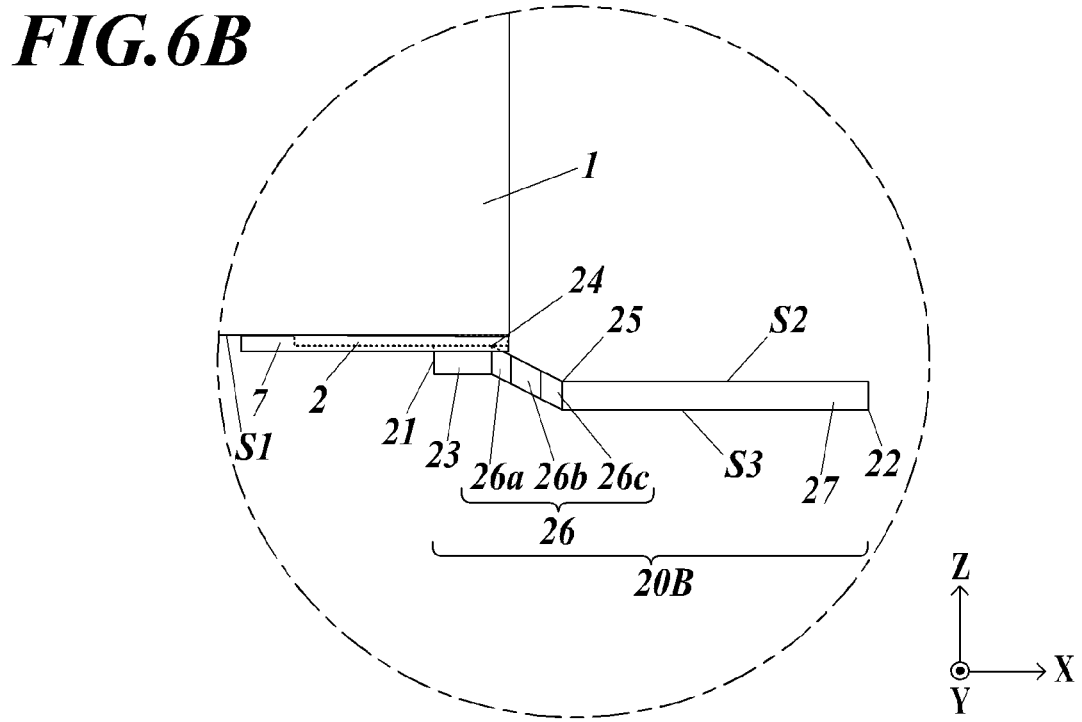
FIG. 6B shows the first lead terminal(s) and its surroundings when the wiring substrate of the second embodiment according to the present disclosure is viewed from the side.

FIG. 6A is a plan view showing the first lead terminals 20B, the second lead terminals 30 and their surroundings when the wiring substrate 10B of the second embodiment according to the present disclosure is viewed toward the first surface S1 of the substrate 1. FIG. 6B shows the first lead terminal(s) 20B and its surroundings when the wiring substrate 10B of the second embodiment according to the present disclosure is viewed from the side.

The first lead terminals 20B are different from the first lead terminals 20A in that whereas in each first lead terminal 20A, the first tapered part 26a and the interconnecting part 26b lie on the substrate 1 in plan perspective view toward the first surface S1, in each first lead terminal 20B, only the first tapered part 26a lies on the substrate 1 in plan perspective view toward the first surface S1.

Each of the first lead terminal 20A and the first lead terminal 20B has the first tapered part 26a located inside of the outer periphery of the substrate 1, and hence can increase, in mid-air, the region area of the part having a short distance D1 between the first lead terminal 20A/20B and the second lead terminal 30. This makes impedance adjustment easy, and hence the wiring substrate 10A/10B of the first/second embodiment can be easily impedance-matched to a desired value. It is noted that the shape of the first lead terminal 20A in the wiring substrate 10A of the first embodiment 1 is advantageous in high-frequency properties because the shape can gain the region area of the part having a short distance D1 to the adjacent second lead terminal(s) 30, in particular in the case where dimensions of the lead part 27 are determined on the basis of an external board.

Figure 7A:
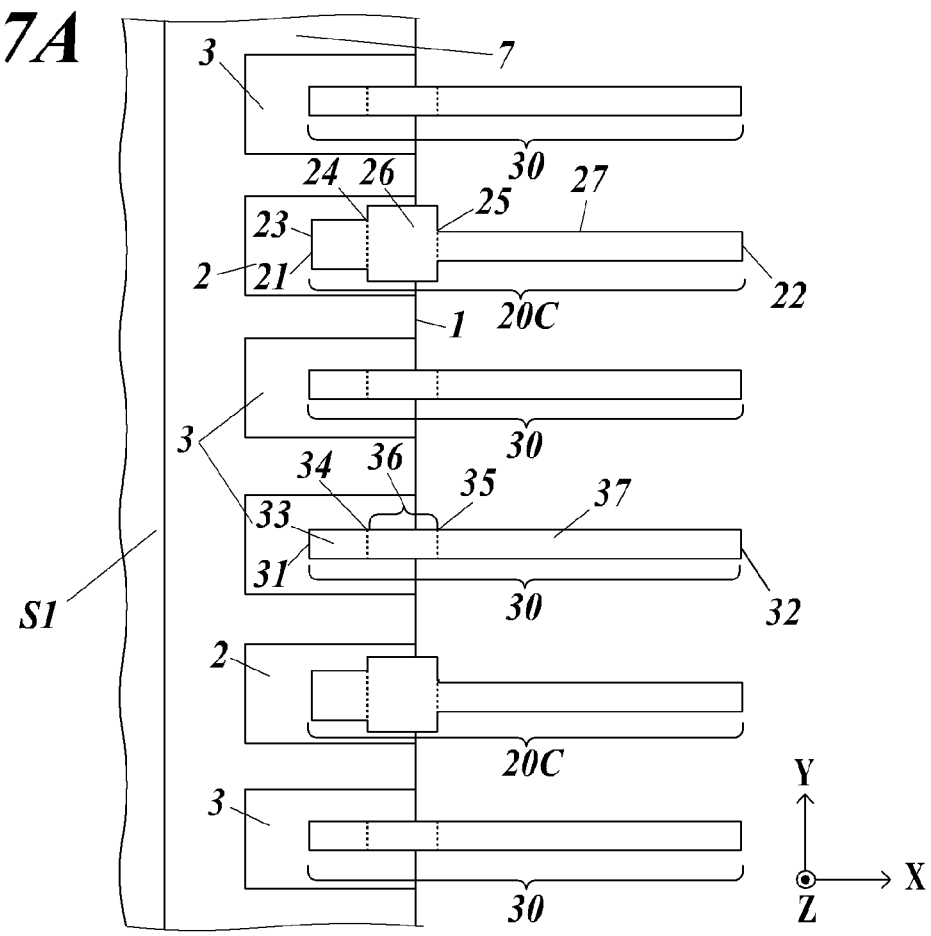
FIG. 7A is a plan view showing first lead terminals, second lead terminals and their surroundings when a wiring substrate of a third embodiment according to the present disclosure is viewed toward a first surface of a substrate.
Figure 7B:
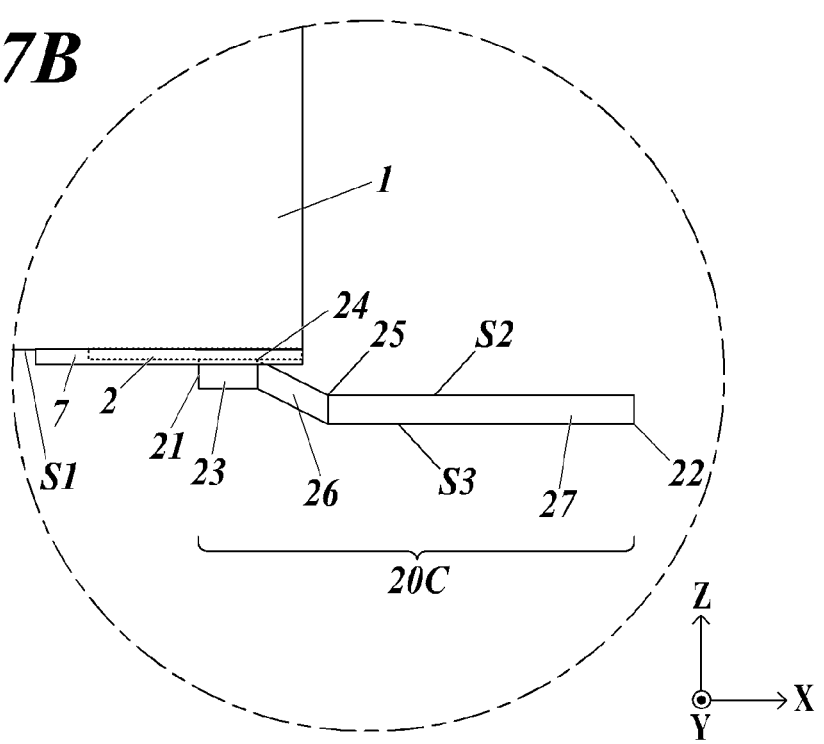
FIG. 7B shows the first lead terminal(s) and its surroundings when the wiring substrate of the third embodiment according to the present disclosure is viewed from the side.

FIG. 7A is a plan view showing the first lead terminals 20C, the second lead terminals 30 and their surroundings when the wiring substrate 10C of the third embodiment according to the present disclosure is viewed toward the first surface S1 of the substrate 1. FIG. 7B shows the first lead terminal(s) 20C and its surroundings when the wiring substrate 10C of the third embodiment according to the present disclosure is viewed from the side.

The first lead terminals 20C are different from the first lead terminals 20A in that whereas in each first lead terminal 20A, the connecting part 26 has the first tapered part 26a, the interconnecting part 26b and the second tapered part 26c, in each first lead terminal 20C, the connecting part 26 is formed as a single rectangle when viewed in the XY plane, which is parallel to the first surface S1. In the first lead terminal 20C, the width at the contacting part 23 increases at once at the first bend 24, the increased width is kept unchanged from the first bend 24 to the second bend 25 and decreases at once at the second bend 25, and the decreased width is kept unchanged at the lead part 27.

In the first lead terminal 20C, an area (region) where the distance D1 between the first lead terminal 20C and the second lead terminal 30 becomes the shortest, namely an area (region) where the width W1 of the first lead terminal 20C becomes the largest, is the entire connecting part 26. As compared with the first lead terminal 20A, the first lead terminal 20C is more likely to reduce crosstalk due to increase in the volume and increase in the area of the part where the distance D1 to the second lead terminal 30 becomes the shortest. The wiring substrate 10C having such a first lead terminal(s) 20C is excellent in high-frequency properties. Since the first lead terminal 20C has the connecting part 26 that is rectangular when viewed in the XY plane, stress may concentrate on the corners. Hence, in the case where strength is required, the first lead terminal 20A is adopted over the first lead terminal 20C.

Figure 8A:
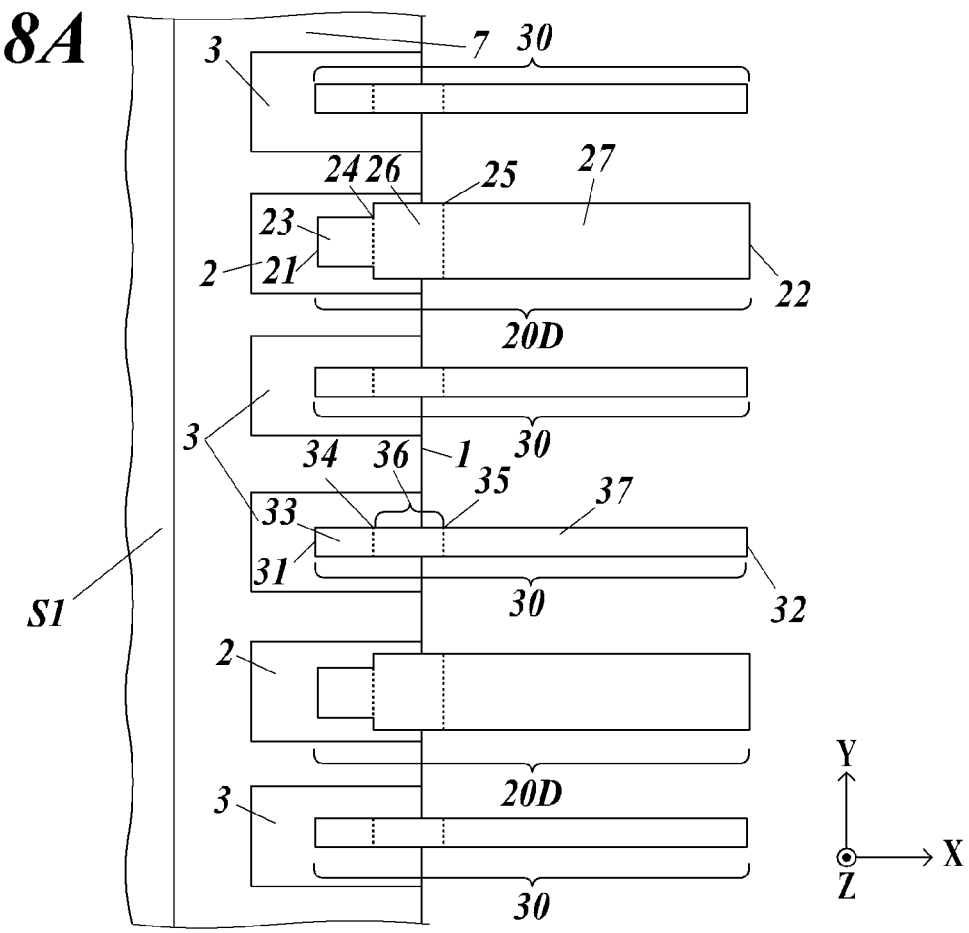
FIG. 8A is a plan view showing first lead terminals, second lead terminals and their surroundings when a wiring substrate of a fourth embodiment according to the present disclosure is viewed toward a first surface of a substrate.
Figure 8B:
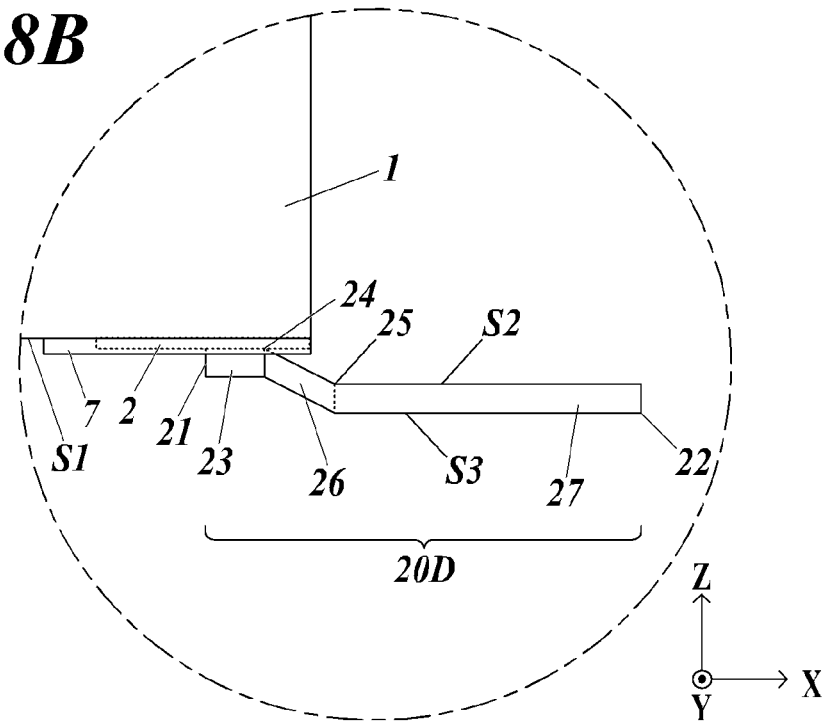
FIG. 8B shows the first lead terminal(s) and its surroundings when the wiring substrate of the fourth embodiment according to the present disclosure is viewed from the side.

FIG. 8A is a plan view showing the first lead terminals 20D, the second lead terminals 30 and their surroundings when the wiring substrate 10D of the fourth embodiment according to the present disclosure is viewed toward the first surface S1 of the substrate 1. FIG. 8B shows the first lead terminal(s) 20D and its surroundings when the wiring substrate 10D of the fourth embodiment according to the present disclosure is viewed from the side.

The first lead terminals 20D are different from the first lead terminals 20A in that whereas in each first lead terminal 20A, the connecting part 26 has the first tapered part 26a, the interconnecting part 26b and the second tapered part 26c, in each first lead terminal 20D, the width at the contacting part 23 increases at once at the first bend 24, and the increased width is kept unchanged from the first bend 24 to the second end 22.

As compared with the first lead terminal 20A and even compared with the first lead terminal 20C, the first lead terminal 20D is more likely to reduce crosstalk due to increase in the volume and increase in the area of the part where the distance D1 to the second lead terminal 30 becomes the shortest. The wiring substrate 10D having such a first lead terminal(s) 20D is excellent in high-frequency properties.

Figure 9A:
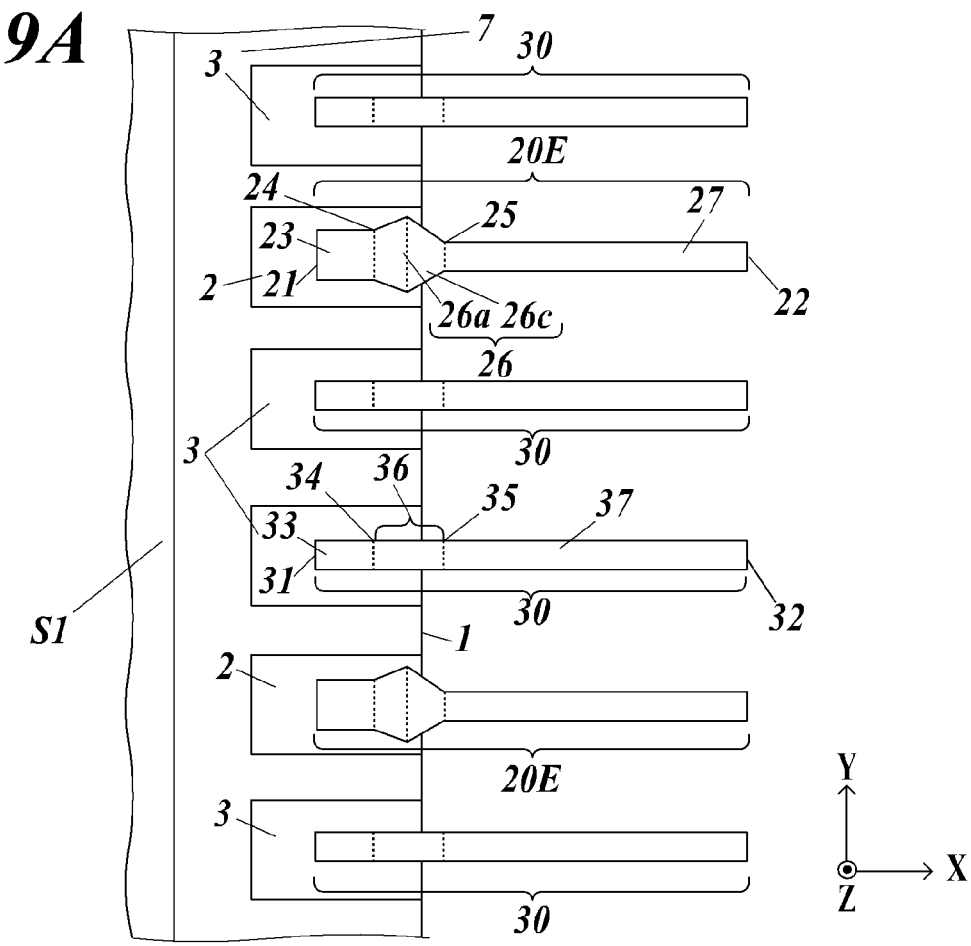
FIG. 9A is a plan view showing first lead terminals, second lead terminals and their surroundings when a wiring substrate of a fifth embodiment according to the present disclosure is viewed toward a first surface of a substrate.
Figure 9B:
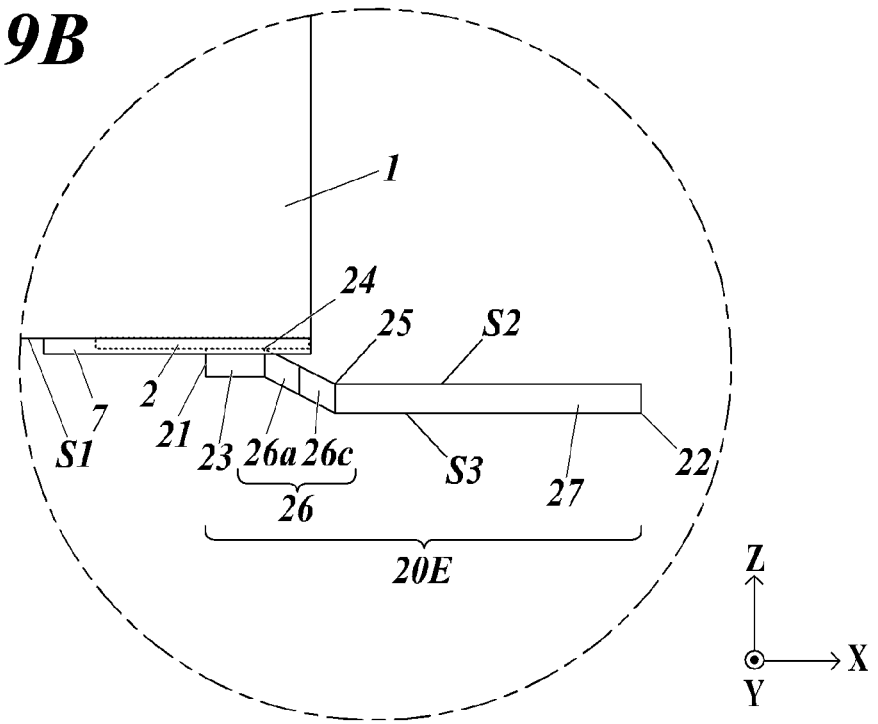
FIG. 9B shows the first lead terminal(s) and its surroundings when the wiring substrate of the fifth embodiment according to the present disclosure is viewed from the side.

FIG. 9A is a plan view showing the first lead terminals 20E, the second lead terminals 30 and their surroundings when the wiring substrate 10E of the fifth embodiment according to the present disclosure is viewed toward the first surface S1 of the substrate 1. FIG. 9B shows the first lead terminal(s) 20E and its surroundings when the wiring substrate 10E of the fifth embodiment according to the present disclosure is viewed from the side.

The first lead terminals 20E are different from the first lead terminals 20A in that whereas in each first lead terminal 20A, the connecting part 26 has the first tapered part 26a, the interconnecting part 26b and the second tapered part 26c, in each first lead terminal 20E, the connecting part 26 has the first tapered part 26a and the second tapered part 26c, but does not have the interconnecting part 26b. In terms of impedance adjustment according to the connecting condition with the signal conductor 3 or an external board, the first lead terminal 20E configured without the interconnecting part 26b may be adopted.

Figure 10A:
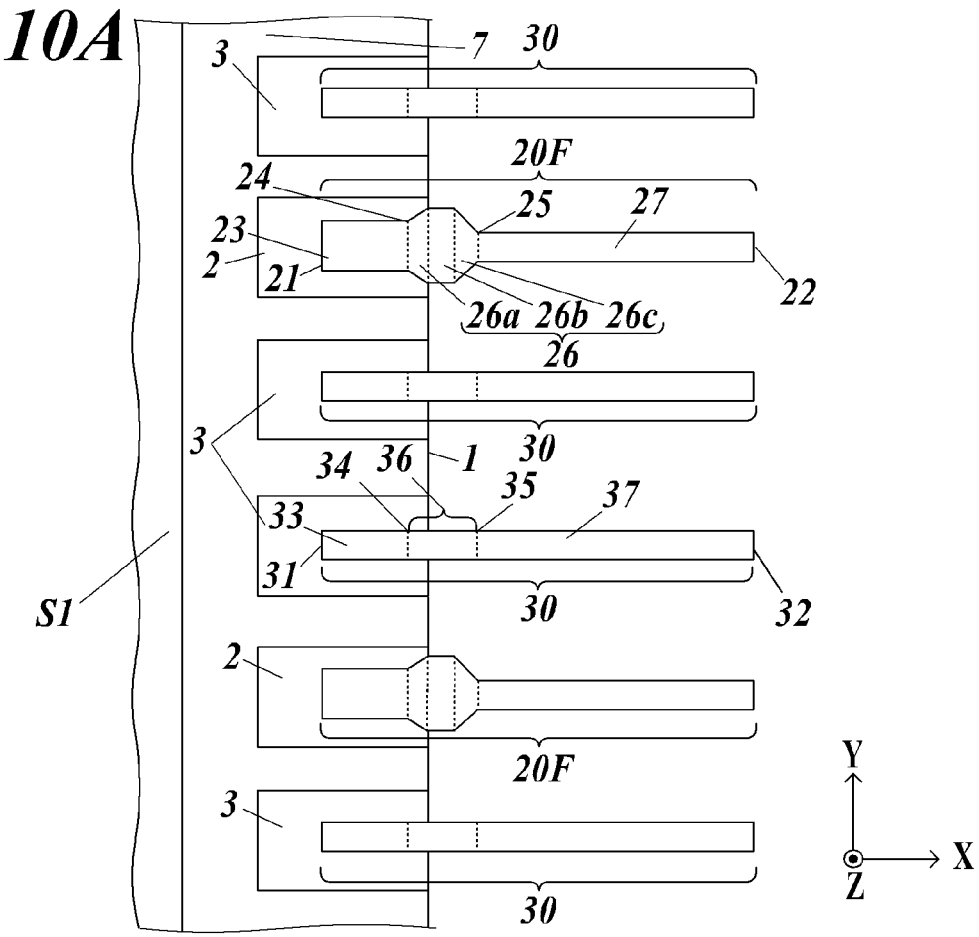
FIG. 10A is a plan view showing first lead terminals, second lead terminals and their surroundings when a wiring substrate of a sixth embodiment according to the present disclosure is viewed toward a first surface of a substrate.
Figure 10B:
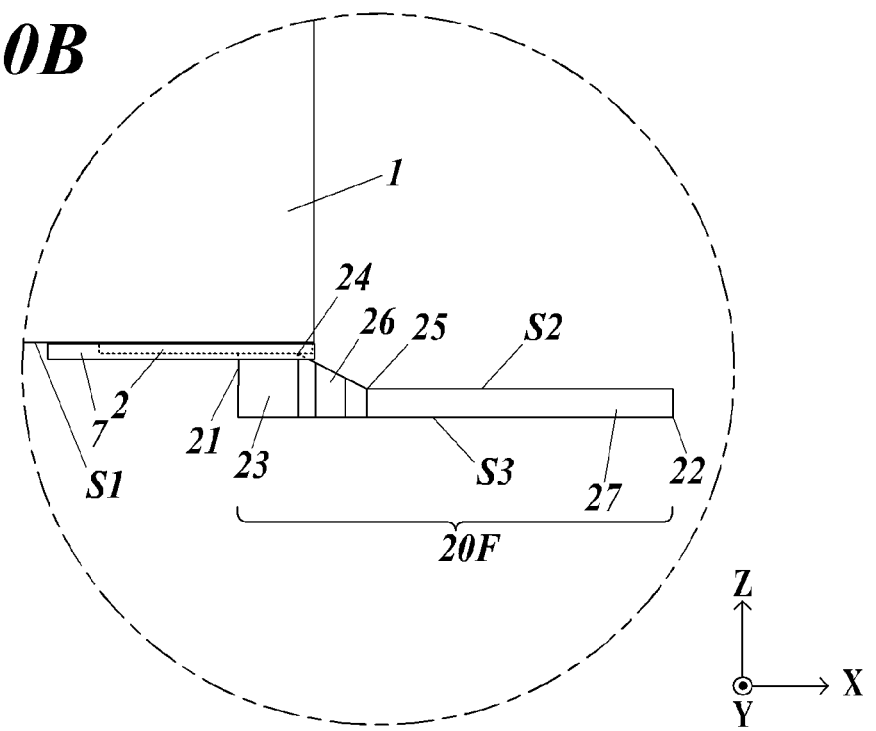
FIG. 10B shows the first lead terminal(s) and its surroundings when the wiring substrate of the sixth embodiment according to the present disclosure is viewed from the side.

FIG. 10A is a plan view showing the first lead terminals 20F, the second lead terminals 30 and their surroundings when the wiring substrate 10F of the sixth embodiment according to the present disclosure is viewed toward the first surface S1 of the substrate 1. FIG. 10B shows the first lead terminal(s) 20F and its surroundings when the wiring substrate 10F of the sixth embodiment according to the present disclosure is viewed from the side.

The first lead terminals 20F are different from the first lead terminals s 20A in the following two points. First, whereas in each first lead terminal 20A, the first tapered part 26a and the interconnecting part 26b lie on the substrate 1 in plan perspective view toward the first surface S1, in each first lead terminal 20F, only the first tapered part 26a lies on the substrate 1 in plan perspective view toward the first surface S1. Second, whereas in each first lead terminal 20A, both the second surface S2 and the third surface S3 are bent at the first bend 24 and the second bend 25, in each first lead terminal 20F, only the second surface S2 is bent at the first bend 24 and the second bend 25, and the third surface S3 is one flat surface from the first end 21 to the second end 22. That is, whereas the first lead terminal 20A has a substantially uniform thickness from the first end 21 to the second end 22, the first lead terminal 20F has a changing thickness from the first end 21 to the second end 22. More specifically, in the first lead terminal 20F, the contacting part 23 is substantially uniformly thick, the lead part 27 is substantially uniformly thin, and the connecting part 26 becomes thinner from the connecting part 23 to the lead part 27.

The first lead terminal 20F has an advantage over the first lead terminal 20A in increasing the volume of a lead terminal itself. Further, the lateral shape of the first lead terminal 20A reduces, when it is joined to an external board, flow of a joining material for connecting the upper surface of the external board to the third surface S3 of the first lead terminal 20F, such as a brazing material, to underneath the contacting part 23. This reduces change in impedance of the first lead terminal 20F and the second lead terminal 30. Hence, the wiring substrate 10A is stable in high-frequency properties.

Wiring Substrate of Seventh Embodiment

Figure 11:
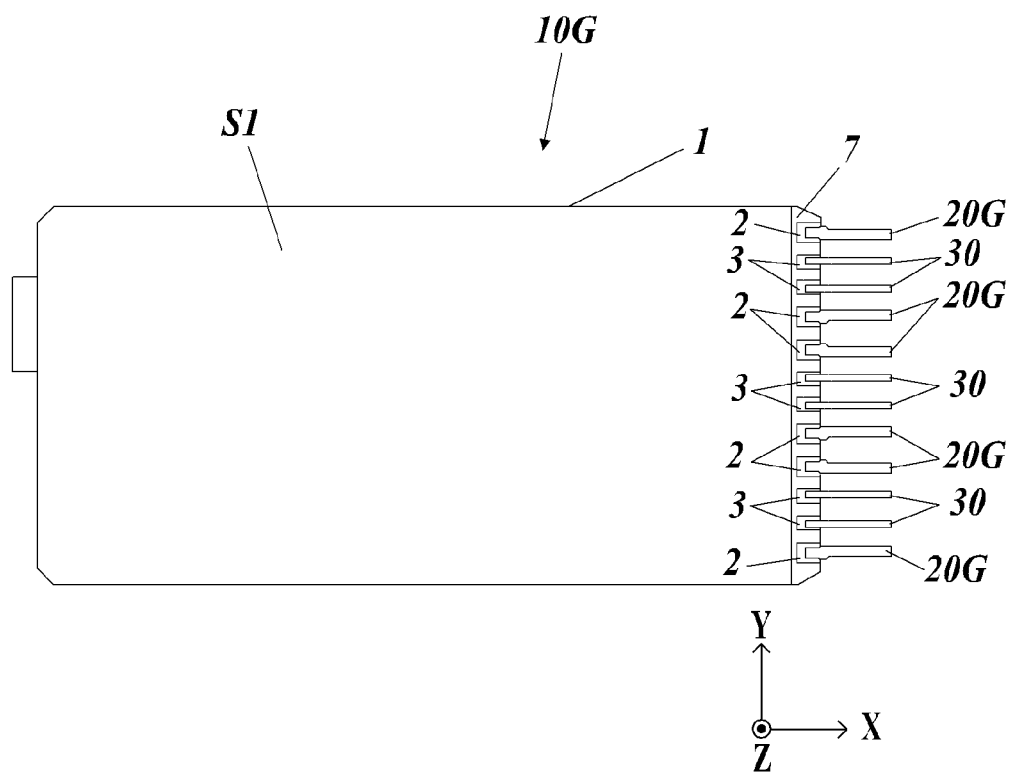
FIG. 11 is a plan view of a wiring substrate of a seventh embodiment according to the present disclosure when viewed toward a first surface of a substrate.
Figure 12:
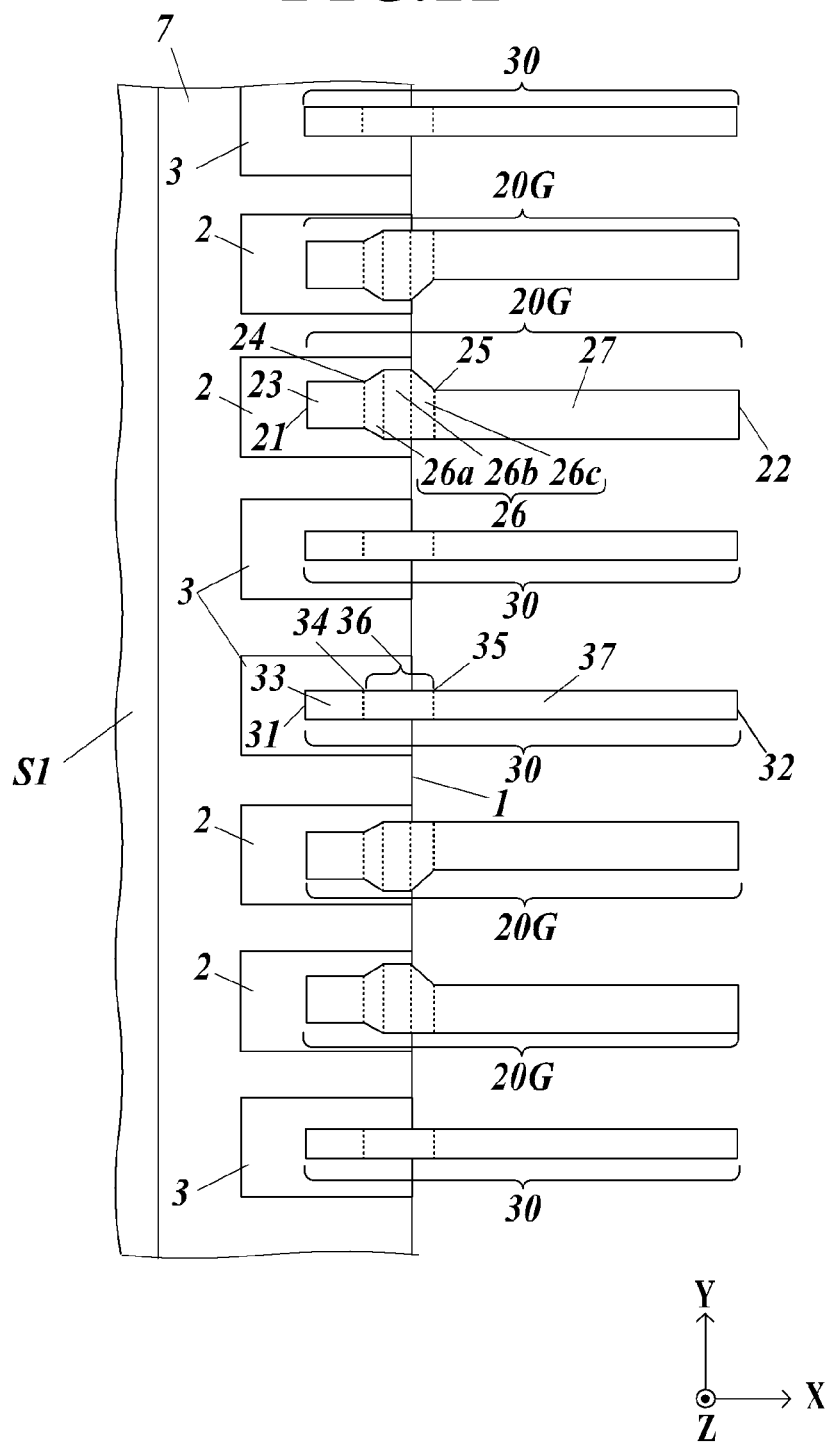
FIG. 12 is an enlarged view of first lead terminals, second lead terminals and their surroundings shown in FIG. 11.
Figure 13:
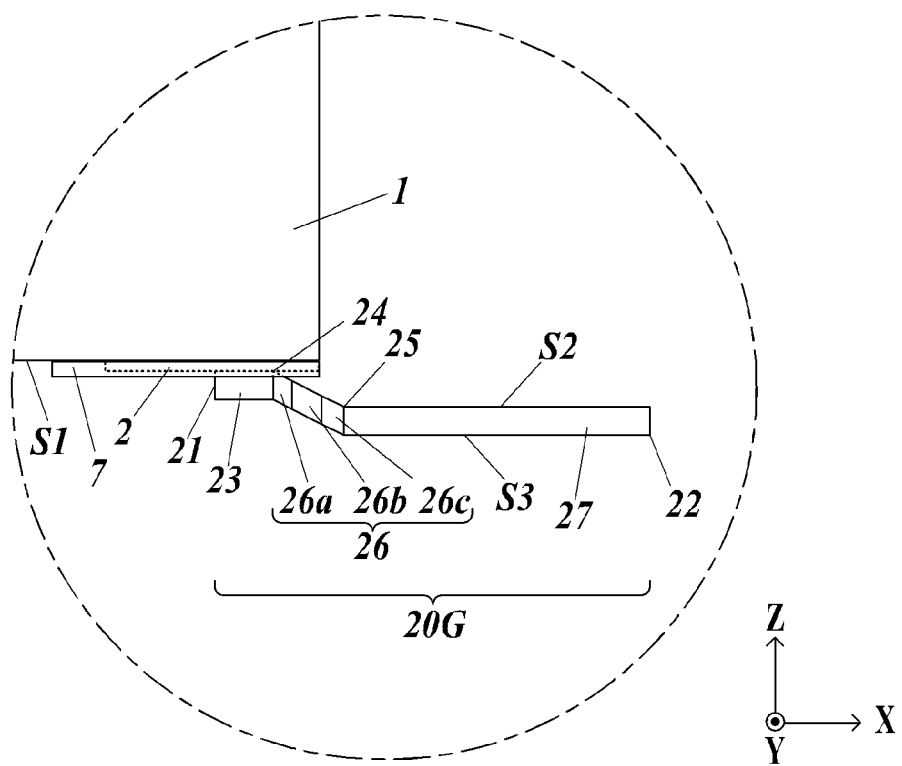
FIG. 13 shows the first lead terminal(s) and its surroundings when the wiring substrate of the seventh embodiment according to the present disclosure is viewed from the side.

FIG. 11 is a plan view of a wiring substrate of a seventh embodiment according to the present disclosure when viewed toward a first surface of a substrate. FIG. 12 is an enlarged view of first lead terminals, second lead terminals and their surroundings shown in FIG. 11. FIG. 13 shows the first lead terminal(s) and its surroundings when the wiring substrate of the seventh embodiment according to the present disclosure is viewed from the side.

A wiring substrate 10G of the seventh embodiment is configured in the same manner as the wiring substrate 10A of the first embodiment except that arrangement of the first lead terminals and the second lead terminals in the wiring substrate 10A of the first embodiment is changed, and the first lead terminals 20A are replaced by first lead terminals 20G. In the following description of the wiring substrate 10G of the seventh embodiment, the same components as those of the wiring substrate 10A of the first embodiment are denoted by the same reference signs as those used in the wiring substrate 10A to avoid duplicate descriptions, and different points from the wiring substrate 10A are mainly described.

In the wiring substrate 10G, the ground conductors 2 and the signal conductors 3 are arranged along one short side of the first surface S1 such that two ground conductors 2 alternate with two signal conductors 3, and at each end, a ground conductor 2 is present. A ground conductor 2 and a signal conductor 3 adjacent to one another and signal conductors 3 adjacent to one another are arranged so as to be insulated from one another.

In the wiring substrate 10A, except for the first lead terminals 20A at the both ends, a first lead terminal 20A is interposed between two second lead terminals 30. In contrast, in the wiring substrate 10G, two second lead terminals 30 are interposed between first lead terminals 20G, which constitutes a GSSG (Ground/Signal/Signal/Ground) differential signal wiring. In other words, in the wiring substrate 10G, second lead terminals 30 as a pair are located so as to be aligned with one another with a pair of first lead terminals 20G interposed therebetween in plan view. More specifically, a configuration in which a pair of first lead terminals 20G is interposed between second lead terminals 30 as a pair is repeated in the Y direction, so that the second lead terminals 30V and the first lead terminals 20A are adjacent to and aligned with one another in plan view.

In the first lead terminal 20A, the connecting part 26 is composed of the first tapered part 26a, the interconnecting part 26b and the second tapered part 26c, and the sides along the length direction are substantially symmetrical about the center line that connects the center of the first end 21 and the center of the second end 22. In the first lead terminal 20G, the connecting part 26 is composed of the first tapered part 26a, the interconnecting part 26b and the second tapered part 26c, and the first tapered part 26a and the interconnecting part 26b are configured in the same manner as those of the first lead terminal 20A, but the second tapered part 26c of the connecting part 26 of the first lead terminal 20G is different from that of the first lead terminal 20A in that only the side opposite the adjacent second lead terminal 30, namely the side facing the adjacent first lead terminal 20G, is tapered.

That is, in the first lead terminal 20G, the sides along the length direction are not symmetrical about the center line that connects the center of the first end 21 and the center of the second end 22. In the first lead terminal 20G, the side close to the adjacent first lead terminal 20G, namely the side facing the adjacent first lead terminal 20G, is configured in the same manner as that of the first lead terminal 20A. Specifically, at the second tapered part 26c, the side facing the adjacent first lead terminal 20G is inclined with respect to the direction from the first end 21 to the second end 22, so that the width W1 of the first lead terminal 20G thereat gradually decreases.

Meanwhile, the side of the first lead terminal 20G close to the adjacent second lead terminal 30, namely the side facing the adjacent second lead terminal 30, is configured differently from that of the first lead terminal 20A. Specifically, the side facing the adjacent second lead terminal 30 gradually gets closer to the second lead terminal 30 at the first tapered part 26a and is parallel to the side(s) along the length direction of the second lead terminal 30 at the interconnecting part 26b, the second tapered part 26c and the lead part 27. More specifically, at the second tapered part 26c, the side facing the adjacent second lead terminal 30 is a straight line along the direction from the first end 21 to the second end 22, namely is parallel to the direction from the first end 21 to the second end 22.

As compared with the first lead terminal 20A, the first lead terminal 20G has an advantage over the first lead terminal 20A in further reducing crosstalk due to increase in the volume and increase in the area of the part where the distance D1 to the second lead terminal 30 becomes the shortest.

Wiring Substrate of Eighth Embodiment

Figure 14:
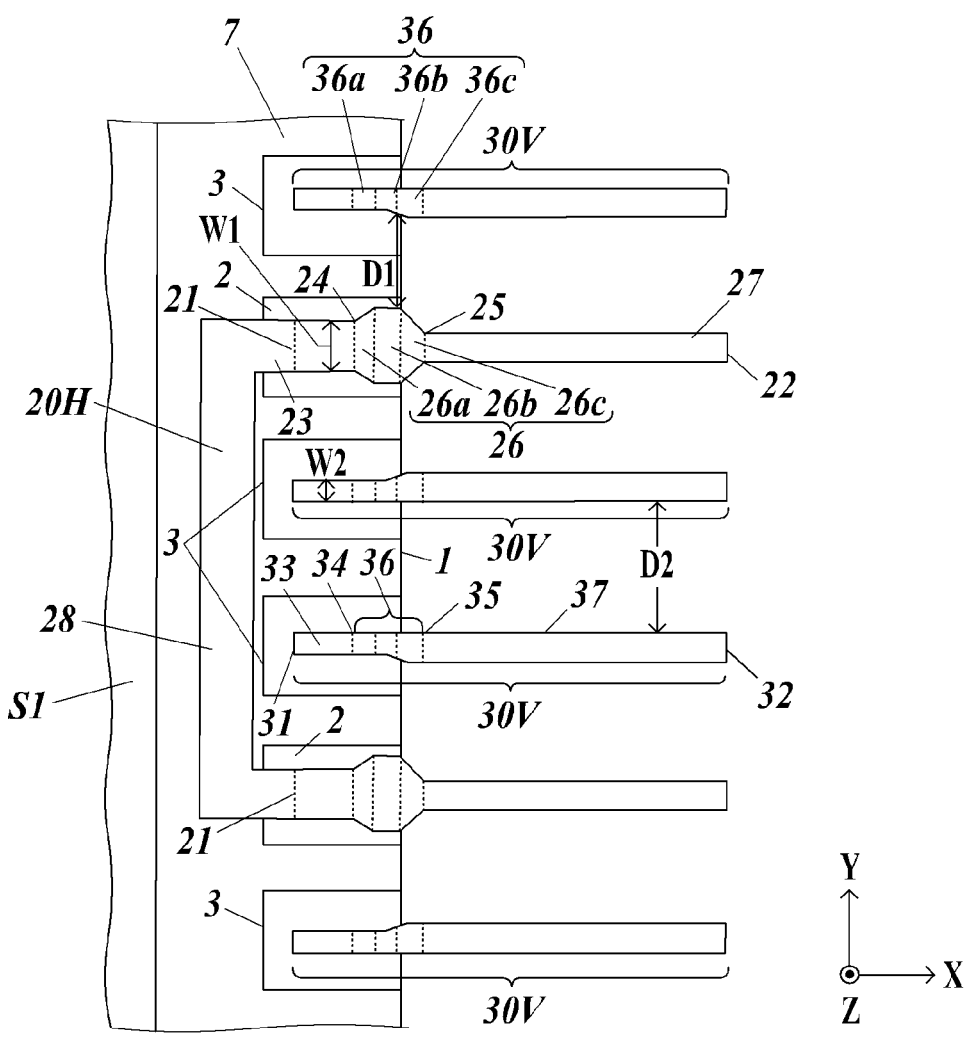
FIG. 14 is a plan view showing first lead terminals, second lead terminals and their surroundings when a wiring substrate of an eighth embodiment according to the present disclosure is viewed toward a first surface of a substrate.

FIG. 14 is a plan view showing first lead terminals, second lead terminals and their surroundings when a wiring substrate of an eighth embodiment according to the present disclosure is viewed toward a first surface of a substrate.

The wiring substrate of the eighth embodiment is configured in the same manner as the wiring substrate 10A' as the modification of the first embodiment except that the first lead terminals 20A in the wiring substrate 10A' as the modification of the first embodiment are replaced by first lead terminals 20H. In the following description of the wiring substrate of the eighth embodiment, the same components as those of the wiring substrate 10A' as the modification of the first embodiment are denoted by the same reference signs as those used in the wiring substrate 10A' to avoid duplicate descriptions, and different points from the wiring substrate 10A' are mainly described.

Hereinafter, the wiring substrate of the eighth embodiment with the first lead terminals 20A replaced by the first lead terminals 20H is referred to as a wiring substrate 10H. Each first lead terminal 20H that the wiring substrate 10H has is configured by connecting, through a connecting part 28, the first ends 21 of first lead terminals 20A as a pair between which a pair of second lead terminals 30V in the wiring substrate 10A' is interposed. In other words, the first lead terminal 20H is configured by having two first lead terminals 20A detailed above as a set.

The connecting part 28 is made of a metal material, and the metal material same as that of the first lead terminals 20A can be used, for example. The connecting part 28 is formed so as not to contact the signal conductors 3 with which the second lead terminals 30V as a pair located inside the first lead terminal 20H are in contact.

The wiring substrate 10H having the above first lead terminals 20H can further reduce occurrence of crosstalk. The lower surfaces of the connecting parts 28 may be electrically connected to the ground conductors 2 by the ground conductors 2 being arranged so as to extend to underneath the connecting parts 28. This can further stabilize the ground of the wiring substrate 10A' and further reduce occurrence of crosstalk.

Electronic Device of Embodiment

Figure 15:
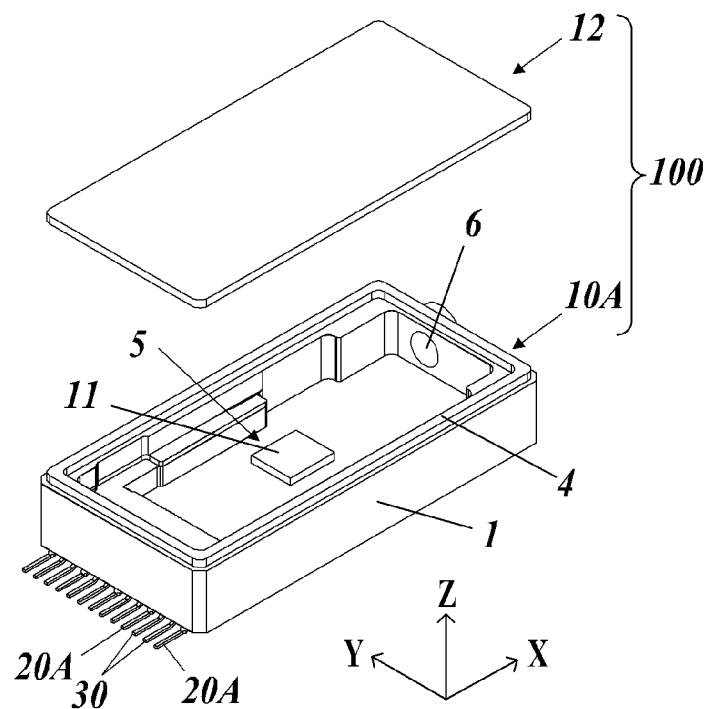
FIG. 15 is an exploded perspective view of an electronic device of an embodiment according to the present disclosure.

FIG. 15 is an exploded perspective view of an electronic device of an embodiment according to the present disclosure. An electronic device 100 has the wiring substrate 10A of the first embodiment, an electronic component 11 mounted on the mounting part 5 of the wiring substrate 10A, and a lid 12.

The electronic component 11 is, for example, a high-frequency semiconductor device. Examples of the semiconductor device include optical semiconductor devices, such as a light emitter and a light receiver. The semiconductor device may be another type of high-frequency semiconductor device, such as a sensor or an imager, as far as it can be housed in the wiring substrate.

In the case where the electronic device 100 of the embodiment is used, for example, an optical fiber is connected and fixed to the through hole 6 provided in the frame 1b of the substrate 1. If the electronic component 11 is, for example, a light emitter, such as an LD (laser diode), light is emitted from the light emitter in response to an electric signal(s) input from the outside via the first lead terminals 20A and the second lead terminals 30 that are respectively in contact with the ground conductors 2 and the signal conductors 3, and the emitted light enters the optical fiber. If the electronic component 11 is, for example, a light receiver, such as a PD (photodiode), light output from the optical fiber is received by the light receiver, and an electric signal(s) corresponding to the amount of the received light is output to the outside via the first lead terminals 20A and the second lead terminals 30 that are respectively in contact with the ground conductors 2 and the signal conductors 3.

The lid 12 may be any type of lid as far as it prevents moisture, fine particles and so forth from entering the interior of the electronic device 100. The lid 12 usable may be formed, for example, by processing or molding the same metal material as that of the seal ring 4 or the same ceramic material as that of the substrate 1 into the shape of a plate. In the case where the electronic component 11 is an optical semiconductor device, such as an LD or a PD, in order to reduce the amount of external light entering the electronic device 100, an opaque lid that hardly transmits light is used as the lid 12. The lid 12 is fixed to the upper surface of the seal ring 4 by seam welding or with a joining material. Examples of the joining material include a brazing material.

The electronic device 100 of the embodiment uses the wiring substrate 10A of the first embodiment, thereby being an electronic device having improved impedance matching, reduced crosstalk, and excellent high-frequency properties.

In the above, several embodiments of the present disclosure have been described. However, the present disclosure is not limited to the above embodiments, and the details described in the embodiments can be appropriately modified within a range not departing from the scope of the present invention.

For example, in each of the above embodiments, the wiring substrate has the coating member, but the coating member is not an essential component. Further, in each of the above embodiments, the ground conductors 2 and the signal conductors 3 are spaced at regular intervals in the width direction, but arrangement of the ground conductors 2 and the signal conductors 3 is not limited thereto.

INDUSTRIAL APPLICABILITY

According to the present disclosure, there can be provided a wiring substrate having improved high-frequency properties. Further, according to the present disclosure, there can be provided an electronic device having excellent high-frequency properties.

REFERENCE SIGNS LIST

10A Wiring Substrate
1 Substrate
2 Ground Conductor
3 Signal Conductor
4 Seal Ring
5 Mounting Part
6 Through Hole
7 Coating Member
20A to 20H First Lead Terminal
21 First End
22 Second End
23 Contacting Part
24 First Bend
25 Second Bend
26 Connecting Part
26a First Tapered Part
26b Interconnecting Part
26c Second Tapered Part
27 Lead Part
30 Second Lead Terminal
31 First End (of Second Lead Terminal)
32 Second End (of Second Lead Terminal)
33 Contacting Part (of Second Lead Terminal)
34 First Bend (of Second Lead Terminal)
35 Second Bend (of Second Lead Terminal)
36 Connecting Part (of Second Lead Terminal)
36a First Interconnecting Part (of Second Lead Terminal)
36b Third Tapered Part (of Second Lead Terminal)
36c Second Interconnecting Part (of Second Lead Terminal)
37 Lead Part (of Second Lead Terminal)
S1 First Surface
S2 Second Surface
S3 Third Surface
100 Electronic Device
11 Electronic Component
12 Lid

The invention claimed is:
1. A wiring substrate comprising:
a substrate having a first surface;
a ground conductor on the first surface;
a signal conductor on the first surface;
a plurality of first lead terminals each in contact with the ground conductor; and
a plurality of second lead terminals each in contact with the signal conductor and aligned with the plurality of first lead terminals,
wherein in plan view, the plurality of second lead terminals as a pair are arranged so as to be aligned with one another with the first lead terminals as a pair interposed therebetween, wherein each of the plurality of first lead terminals include:
a first end on the substrate in plan perspective view toward the first surface,
a second end not on the substrate in the plan perspective view but at a position on an extension from the first end,
a contacting part including the first end and in contact with the ground conductor,
a connecting part including:
a first bend away from the first end across the contacting part, and
a second bend closer to the second end than the first bend, and
a lead part connected to the second bend and extending to the second end,
wherein the connecting part includes:
a short-distance part having a shorter distance to the plurality of second lead terminals than the contacting part in the plan view toward the first surface,
a first tapered part between the contacting part and the short-distance part, and the first tapered part widening toward the second end, and
a second tapered part closer to the second end than the first tapered part, the second tapered part narrowing toward the second end,
wherein at the second tapered part, a first side of each of the plurality of first lead terminals facing an adjacent one of the plurality of second lead terminals is a straight line along a direction from the first end to the second end, and
wherein at the second tapered part, a second side of each of the plurality of first lead terminals facing an adjacent one of the plurality of first lead terminals is inclined with respect to the direction from the first end to the second end.

2. The wiring substrate according to claim 1, wherein the first tapered part lies on the substrate in the plan perspective view.

3. The wiring substrate according to claim 1, wherein at least one of
the first tapered part gradually widens toward the second end at a predetermined rate,
the second tapered part gradually narrows toward the second end at a predetermined rate.

4. The wiring substrate according to claim 1, wherein the connecting part includes an interconnecting part between the first tapered part and the second tapered part.

5. The wiring substrate according to claim 4, wherein a width of the interconnecting part is uniform toward the second end.

6. The wiring substrate according to claim 1,
wherein each of the plurality of second lead terminals are, in the plan view, adjacent to one of the plurality of first lead terminals,
wherein each of the plurality of second lead terminals includes a third tapered part at which,
wherein, in the plan view, a side of each of the plurality of second lead terminals facing an adjacent one of the plurality of first lead terminals has a shorter distance to the adjacent one of the plurality of first lead terminals as the side further separates from the signal conductor.

7. The wiring substrate according to claim 6,
wherein in the plan view, a width of the short-distance part is uniform, and
wherein the third tapered part is, in the plan view, at least partly adjacent to the short-distance part.

8. The wiring substrate according to claim 6, wherein, in a direction from the first end to the second end,
an end of the third tapered part close to the signal conductor is, in the plan view, closer to the second end than an end of the short-distance part close to the ground conductor, and
an end of the third tapered part far from the signal conductor is, in the plan view, closer to the first end than an end of the short-distance part far from the ground conductor.

9. The wiring substrate according to claim 1,
wherein each of the plurality of first lead terminals has a second surface facing the first surface and a third surface opposite the second surface, and
wherein the third surface is one flat surface from the first end to the second end.

10. An electronic device comprising:
the wiring substrate according to claim 1; and
an electronic component connected to the wiring substrate.

11. The wiring substrate according to claim 1, further comprising, on the substrate, a coating member that surrounds the ground conductor and is made of a ceramic material or a glass ceramic material.

12. The wiring substrate according to claim 1, further comprising, on the substrate, a coating member that surrounds the signal conductor and is made of a ceramic material or a glass ceramic material.

* * * * *